(12) United States Patent
Weir et al.

(10) Patent No.: US 9,079,762 B2
(45) Date of Patent: Jul. 14, 2015

(54) MICRO-ELECTROMECHANICAL DEVICE

(75) Inventors: Michael P. Weir, Cincinnati, OH (US); Robert J. Dunki-Jacobs, Cincinnati, OH (US)

(73) Assignee: Ethicon Endo-Surgery, Inc., Cincinnati, OH (US)

( * ) Notice: Subject to any disclaimer, the term of this patent is extended or adjusted under 35 U.S.C. 154(b) by 2792 days.

(21) Appl. No.: 11/525,604

(22) Filed: Sep. 22, 2006

(65) Prior Publication Data
US 2008/0073163 A1    Mar. 27, 2008

(51) Int. Cl.
*B81B 3/00* (2006.01)
*B81B 7/00* (2006.01)

(52) U.S. Cl.
CPC ............. *B81B 3/0051* (2013.01); *B81B 7/0012* (2013.01)

(58) Field of Classification Search
None
See application file for complete search history.

(56) References Cited

U.S. PATENT DOCUMENTS

| | | |
|---|---|---|
| 3,758,199 A | 9/1973 | Thaxter |
| 3,959,582 A | 5/1976 | Law et al. |
| 4,082,635 A | 4/1978 | Fritz et al. |
| 4,141,362 A | 2/1979 | Wurster |
| 4,313,431 A | 2/1982 | Frank |
| 4,324,761 A | 4/1982 | Harris ET AL |
| 4,379,039 A | 4/1983 | Fujimoto et al. |
| 4,403,273 A | 9/1983 | Nishioka |
| 4,409,477 A | 10/1983 | Carl |
| 4,421,382 A | 12/1983 | Doi et al. |
| 4,527,552 A | 7/1985 | Hattori |
| 4,573,465 A | 3/1986 | Sugiyama et al. |
| 4,576,999 A | 3/1986 | Eckberg |
| 4,597,380 A | 7/1986 | Raif et al. |
| 4,643,967 A | 2/1987 | Bryant |
| 4,676,231 A | 6/1987 | Hisazumi et al. |
| 4,760,840 A | 8/1988 | Fournier, Jr. et al. |
| 4,803,550 A | 2/1989 | Yabe et al. |
| 4,872,458 A | 10/1989 | Kanehira et al. |
| 4,902,083 A | 2/1990 | Wells |
| 4,902,115 A | 2/1990 | Takahashi |
| 4,934,773 A | 6/1990 | Becker |
| 4,938,205 A | 7/1990 | Nudelman |
| 5,003,300 A | 3/1991 | Wells |
| 5,023,905 A | 6/1991 | Wells et al. |
| 5,048,077 A | 9/1991 | Wells et al. |
| 5,074,860 A | 12/1991 | Gregory et al. |
| 5,078,150 A | 1/1992 | Hara et al. |

(Continued)

FOREIGN PATENT DOCUMENTS

| | | |
|---|---|---|
| DE | 3837248 | 5/1990 |
| EP | 1139141 | 10/2001 |

(Continued)

OTHER PUBLICATIONS

Invitation to Pay Additional Fees with Partial International Search Report, PCT/US2008/074275 (Jan. 16, 2009).

(Continued)

*Primary Examiner* — Robert A Siconolfi
*Assistant Examiner* — James Hsiao

(57) ABSTRACT

A micro-electromechanical device includes a frame, a moveable member movably connected to the frame such that the moveable member is capable of movement relative to the frame and drive system for use in moving the moveable member relative to the frame. A braking system is provided that inhibits movement of the moveable member relative to the frame.

37 Claims, 17 Drawing Sheets

(56) References Cited

U.S. PATENT DOCUMENTS

| | | |
|---|---|---|
| 5,163,936 A | 11/1992 | Black et al. |
| 5,163,945 A | 11/1992 | Ortiz et al. |
| 5,172,685 A | 12/1992 | Nudelman |
| 5,192,288 A | 3/1993 | Thompson et al. |
| 5,200,819 A | 4/1993 | Nudelman et al. |
| 5,200,838 A | 4/1993 | Nudelman et al. |
| 5,207,670 A | 5/1993 | Sinofsky |
| 5,218,195 A | 6/1993 | Hakamata |
| 5,251,025 A | 10/1993 | Cooper et al. |
| 5,251,613 A | 10/1993 | Adair |
| 5,269,289 A | 12/1993 | Takehana et al. |
| 5,318,024 A | 6/1994 | Kittrell et al. |
| 5,334,991 A | 8/1994 | Wells et al. |
| 5,368,015 A | 11/1994 | Wilk |
| 5,370,643 A | 12/1994 | Krivoshlykov et al. |
| 5,387,197 A | 2/1995 | Smith et al. |
| 5,393,647 A | 2/1995 | Neukermans et al. |
| 5,436,655 A | 7/1995 | Hiyama et al. |
| 5,467,104 A | 11/1995 | Furness, III et al. |
| 5,488,862 A | 2/1996 | Neukermans et al. |
| 5,531,740 A | 7/1996 | Black |
| 5,545,211 A | 8/1996 | An et al. |
| 5,552,452 A | 9/1996 | Khadem et al. |
| 5,557,444 A | 9/1996 | Melville et al. |
| 5,590,660 A | 1/1997 | MacAulay et al. |
| 5,596,339 A | 1/1997 | Furness, III et al. |
| 5,608,451 A | 3/1997 | Konno et al. |
| 5,629,790 A | 5/1997 | Neukermans et al. |
| 5,648,618 A | 7/1997 | Neukermans et al. |
| 5,649,952 A | 7/1997 | Lam |
| 5,657,165 A | 8/1997 | Karpman et al. |
| 5,658,710 A | 8/1997 | Neukermans |
| 5,659,327 A | 8/1997 | Furness, III et al. |
| 5,694,237 A | 12/1997 | Melville |
| 5,701,132 A | 12/1997 | Kollin et al. |
| 5,713,891 A | 2/1998 | Poppas |
| 5,728,121 A | 3/1998 | Bimbo et al. |
| 5,735,792 A | 4/1998 | Vanden Hoek et al. |
| 5,742,419 A | 4/1998 | Dickensheets et al. |
| 5,742,421 A | 4/1998 | Wells et al. |
| 5,751,465 A | 5/1998 | Melville et al. |
| 5,768,461 A | 6/1998 | Svetkoff et al. |
| 5,797,944 A | 8/1998 | Nobles et al. |
| 5,817,061 A | 10/1998 | Goodwin et al. |
| 5,823,943 A | 10/1998 | Tomioka et al. |
| 5,827,176 A | 10/1998 | Tanaka et al. |
| 5,827,190 A | 10/1998 | Palcic et al. |
| 5,841,553 A | 11/1998 | Neukermans |
| 5,861,549 A | 1/1999 | Neukermans et al. |
| 5,867,297 A | 2/1999 | Kiang et al. |
| 5,895,866 A | 4/1999 | Neukermans et al. |
| 5,903,397 A | 5/1999 | Melville et al. |
| 5,907,425 A | 5/1999 | Dickensheets et al. |
| 5,913,591 A | 6/1999 | Melville |
| 5,947,930 A | 9/1999 | Schwemberger et al. |
| 5,955,817 A * | 9/1999 | Dhuler et al. ................. 310/307 |
| 5,969,465 A | 10/1999 | Neukermans et al. |
| 5,969,871 A | 10/1999 | Tidwell et al. |
| 5,982,528 A | 11/1999 | Melville |
| 5,982,555 A | 11/1999 | Melville et al. |
| 5,993,037 A | 11/1999 | Tomioka et al. |
| 5,995,264 A | 11/1999 | Melville |
| 5,998,906 A * | 12/1999 | Jerman et al. ................. 310/309 |
| 6,007,208 A | 12/1999 | Dickensheets et al. |
| 6,008,781 A | 12/1999 | Furness, III et al. |
| 6,013,025 A | 1/2000 | Bonne et al. |
| 6,016,440 A | 1/2000 | Simon et al. |
| 6,017,356 A | 1/2000 | Frederick et al. |
| 6,017,603 A | 1/2000 | Tokuda et al. |
| 6,024,744 A | 2/2000 | Kese et al. |
| 6,043,799 A | 3/2000 | Tidwell |
| 6,044,705 A | 4/2000 | Neukermans et al. |
| 6,046,720 A | 4/2000 | Melville et al. |
| 6,049,407 A | 4/2000 | Melville |
| 6,056,721 A | 5/2000 | Shulze |
| 6,057,952 A | 5/2000 | Kubo et al. |
| 6,059,720 A | 5/2000 | Furusawa et al. |
| 6,061,163 A | 5/2000 | Melville |
| 6,064,779 A | 5/2000 | Neukermans et al. |
| 6,069,725 A | 5/2000 | Melville |
| 6,086,528 A | 7/2000 | Adair |
| 6,086,531 A | 7/2000 | Tomioka et al. |
| 6,088,145 A | 7/2000 | Dickensheets et al. |
| 6,097,353 A | 8/2000 | Melville et al. |
| 6,122,394 A | 9/2000 | Neukermans et al. |
| 6,139,175 A | 10/2000 | Tomioka et al. |
| 6,140,979 A | 10/2000 | Gerhard et al. |
| 6,151,167 A | 11/2000 | Melville |
| 6,154,305 A | 11/2000 | Dickensheets et al. |
| 6,154,321 A | 11/2000 | Melville et al. |
| 6,157,352 A | 12/2000 | Kollin et al. |
| 6,166,841 A | 12/2000 | Melville |
| 6,172,789 B1 | 1/2001 | Kino et al. |
| 6,178,346 B1 | 1/2001 | Amundson et al. |
| 6,179,776 B1 | 1/2001 | Adams et al. |
| 6,191,761 B1 | 2/2001 | Melville et al. |
| 6,192,267 B1 | 2/2001 | Scherninski et al. |
| 6,200,595 B1 | 3/2001 | Motoyashiki et al. |
| 6,204,829 B1 | 3/2001 | Tidwell |
| 6,204,832 B1 | 3/2001 | Melville et al. |
| 6,207,392 B1 | 3/2001 | Weiss et al. |
| 6,210,401 B1 | 4/2001 | Lai |
| 6,220,711 B1 | 4/2001 | Melville |
| 6,221,068 B1 | 4/2001 | Fried et al. |
| 6,229,139 B1 | 5/2001 | Neukermans et al. |
| 6,235,017 B1 | 5/2001 | Jegorov et al. |
| 6,243,186 B1 | 6/2001 | Melville |
| 6,245,590 B1 | 6/2001 | Wine et al. |
| 6,256,131 B1 | 7/2001 | Wine et al. |
| 6,257,727 B1 | 7/2001 | Melville |
| 6,272,907 B1 | 8/2001 | Neukermans et al. |
| 6,276,798 B1 | 8/2001 | Gil et al. |
| 6,281,862 B1 | 8/2001 | Tidwell et al. |
| 6,284,185 B1 | 9/2001 | Tokuda et al. |
| 6,285,489 B1 | 9/2001 | Helsel et al. |
| 6,285,505 B1 | 9/2001 | Melville et al. |
| 6,288,816 B1 | 9/2001 | Melville et al. |
| 6,292,287 B1 | 9/2001 | Fujinoki |
| 6,293,911 B1 | 9/2001 | Imaizumi et al. |
| 6,294,239 B1 | 9/2001 | Tokuda et al. |
| 6,294,775 B1 | 9/2001 | Seibel et al. |
| 6,317,103 B1 | 11/2001 | Furness, III et al. |
| 6,323,037 B1 | 11/2001 | Lauto et al. |
| 6,324,007 B1 | 11/2001 | Melville |
| 6,327,493 B1 | 12/2001 | Ozawa et al. |
| 6,331,909 B1 | 12/2001 | Dunfield |
| 6,333,110 B1 | 12/2001 | Barbera-Guillem |
| 6,338,641 B2 | 1/2002 | Nicholls |
| 6,352,344 B2 | 3/2002 | Tidwell |
| 6,353,183 B1 | 3/2002 | Ott et al. |
| 6,362,912 B1 | 3/2002 | Lewis et al. |
| 6,364,829 B1 | 4/2002 | Fulghum |
| 6,369,928 B1 | 4/2002 | Mandella et al. |
| 6,369,953 B2 | 4/2002 | Melville et al. |
| 6,369,954 B1 | 4/2002 | Berge et al. |
| 6,370,406 B1 | 4/2002 | Wach et al. |
| 6,370,422 B1 | 4/2002 | Richards-Kortum et al. |
| 6,373,995 B1 | 4/2002 | Moore |
| 6,384,406 B1 | 5/2002 | Wine et al. |
| 6,388,641 B2 | 5/2002 | Tidwell et al. |
| 6,392,220 B1 | 5/2002 | Slater et al. |
| 6,396,461 B1 | 5/2002 | Lewis et al. |
| 6,414,779 B1 | 7/2002 | Mandella et al. |
| 6,417,502 B1 | 7/2002 | Stoner et al. |
| 6,423,956 B1 | 7/2002 | Mandella et al. |
| 6,425,900 B1 | 7/2002 | Knodel et al. |
| 6,426,013 B1 | 7/2002 | Neukermans et al. |
| 6,433,907 B1 | 8/2002 | Lippert et al. |
| 6,435,637 B1 | 8/2002 | Lyman |
| 6,441,356 B1 | 8/2002 | Mandella et al. |
| 6,445,362 B1 | 9/2002 | Tegreene |
| 6,447,524 B1 | 9/2002 | Knodel et al. |
| 6,462,770 B1 | 10/2002 | Cline et al. |
| 6,464,363 B1 | 10/2002 | Nishioka et al. |

(56) References Cited

U.S. PATENT DOCUMENTS

| | | | |
|---|---|---|---|
| 6,467,345 B1 | 10/2002 | Neukermans et al. | |
| 6,470,124 B1 | 10/2002 | Le Gargasson et al. | |
| 6,477,403 B1 | 11/2002 | Eguchi et al. | |
| 6,478,809 B1 | 11/2002 | Brotz | |
| 6,485,413 B1 | 11/2002 | Boppart et al. | |
| 6,492,962 B2 | 12/2002 | Melville et al. | |
| 6,494,578 B1 | 12/2002 | Plummer et al. | |
| 6,503,196 B1 | 1/2003 | Kehr et al. | |
| 6,510,338 B1 | 1/2003 | Irion et al. | |
| 6,512,622 B2 | 1/2003 | Wine et al. | |
| 6,513,939 B1 | 2/2003 | Fettig et al. | |
| 6,515,278 B2 | 2/2003 | Wine et al. | |
| 6,515,781 B2 | 2/2003 | Lewis et al. | |
| 6,520,972 B2 | 2/2003 | Peters | |
| 6,522,444 B2 | 2/2003 | Mandella et al. | |
| 6,525,310 B2 | 2/2003 | Dunfield | |
| 6,527,708 B1 | 3/2003 | Nakamura et al. | |
| 6,529,770 B1 | 3/2003 | Grimblatov | |
| 6,530,698 B1 | 3/2003 | Kuhara et al. | |
| 6,535,183 B2 | 3/2003 | Melville et al. | |
| 6,535,325 B2 | 3/2003 | Helsel et al. | |
| 6,537,211 B1 | 3/2003 | Wang et al. | |
| 6,538,625 B2 | 3/2003 | Tidwell et al. | |
| 6,545,260 B1 | 4/2003 | Ono ET AL | |
| 6,560,028 B2 | 5/2003 | Melville et al. | |
| 6,563,105 B2 | 5/2003 | Seibel et al. | |
| 6,563,106 B1 | 5/2003 | Bowers et al. | |
| 6,572,606 B2 | 6/2003 | Kliewer et al. | |
| 6,583,117 B2 | 6/2003 | Owen et al. | |
| 6,583,772 B1 | 6/2003 | Lewis et al. | |
| 6,585,642 B2 | 7/2003 | Christopher | |
| 6,603,552 B1 | 8/2003 | Cline et al. | |
| 6,608,297 B2 | 8/2003 | Neukermans et al. | |
| 6,639,570 B2 | 10/2003 | Furness, III et al. | |
| 6,639,719 B2 | 10/2003 | Tegreene et al. | |
| 6,650,877 B1 | 11/2003 | Tarbouriech et al. | |
| 6,653,621 B2 | 11/2003 | Wine et al. | |
| 6,654,158 B2 | 11/2003 | Helsel et al. | |
| 6,661,393 B2 | 12/2003 | Tegreene et al. | |
| 6,674,993 B1 | 1/2004 | Tarbouriech | |
| 6,685,804 B1 | 2/2004 | Ikeda et al. | |
| 6,687,034 B2 | 2/2004 | Wine et al. | |
| 6,689,056 B1 | 2/2004 | Kilcoyne et al. | |
| 6,699,170 B1 | 3/2004 | Crocker et al. | |
| 6,700,552 B2 | 3/2004 | Kollin et al. | |
| 6,714,331 B2 | 3/2004 | Lewis et al. | |
| 6,734,835 B2 | 5/2004 | Tidwell et al. | |
| 6,736,511 B2 | 5/2004 | Plummer et al. | |
| 6,741,884 B1 | 5/2004 | Freeman et al. | |
| 6,744,173 B2 * | 6/2004 | Behin et al. | 310/309 |
| 6,749,346 B1 | 6/2004 | Dickensheets et al. | |
| 6,755,536 B2 | 6/2004 | Tegreene et al. | |
| 6,762,867 B2 | 7/2004 | Lippert et al. | |
| 6,768,588 B2 | 7/2004 | Urey | |
| 6,771,001 B2 | 8/2004 | Mao et al. | |
| 6,782,748 B2 | 8/2004 | Weber et al. | |
| 6,786,382 B1 | 9/2004 | Hoffman | |
| 6,788,840 B2 * | 9/2004 | Stewart et al. | 385/16 |
| 6,795,221 B1 | 9/2004 | Urey | |
| 6,802,809 B2 | 10/2004 | Okada | |
| 6,803,561 B2 | 10/2004 | Dunfield | |
| 6,807,334 B2 * | 10/2004 | Schroeder et al. | 385/18 |
| 6,821,245 B2 | 11/2004 | Cline et al. | |
| 6,845,190 B1 | 1/2005 | Smithwick et al. | |
| 6,847,661 B2 * | 1/2005 | Jerman et al. | 372/20 |
| 6,856,436 B2 | 2/2005 | Brukilacchio et al. | |
| 6,856,712 B2 | 2/2005 | Fauver et al. | |
| 6,879,428 B2 | 4/2005 | Massieu | |
| 6,888,552 B2 | 5/2005 | Debevec et al. | |
| 6,894,823 B2 | 5/2005 | Taylor et al. | |
| 6,899,675 B2 | 5/2005 | Cline et al. | |
| 6,902,527 B1 | 6/2005 | Doguchi et al. | |
| 6,903,486 B2 * | 6/2005 | Jerman et al. | 310/309 |
| 6,905,057 B2 | 6/2005 | Swayze et al. | |
| 6,909,221 B2 * | 6/2005 | Ayazi et al. | 310/321 |
| 6,925,710 B1 * | 8/2005 | Scalf et al. | 29/847 |
| 6,939,364 B1 | 9/2005 | Soltz et al. | |
| 6,947,189 B2 * | 9/2005 | Hagelin et al. | 359/201.1 |
| 6,957,898 B2 | 10/2005 | Yu | |
| 6,967,757 B1 | 11/2005 | Allen et al. | |
| 6,974,472 B2 | 12/2005 | Hong et al. | |
| 6,975,898 B2 * | 12/2005 | Seibel | 600/473 |
| 6,976,994 B2 | 12/2005 | Ballou et al. | |
| 6,978,921 B2 | 12/2005 | Shelton, IV et al. | |
| 6,982,515 B2 * | 1/2006 | Howell et al. | 310/307 |
| 6,985,271 B2 | 1/2006 | Yazdi et al. | |
| 6,991,602 B2 | 1/2006 | Nakazawa et al. | |
| 6,993,218 B2 * | 1/2006 | Kanie et al. | 385/18 |
| 7,005,195 B2 | 2/2006 | Cheng et al. | |
| 7,009,634 B2 | 3/2006 | Iddan et al. | |
| 7,013,730 B2 | 3/2006 | Malametz | |
| 7,015,956 B2 | 3/2006 | Luo et al. | |
| 7,018,401 B1 | 3/2006 | Hyodoh et al. | |
| 7,019,887 B1 * | 3/2006 | Guo et al. | 359/290 |
| 7,023,402 B2 | 4/2006 | Lewis et al. | |
| 7,025,777 B2 | 4/2006 | Moore | |
| 7,033,348 B2 | 4/2006 | Alfano et al. | |
| 7,035,777 B2 | 4/2006 | Araki et al. | |
| 7,046,410 B2 * | 5/2006 | Deutsch et al. | 359/224.1 |
| 7,050,670 B2 * | 5/2006 | Schroeder | 385/18 |
| 7,061,450 B2 | 6/2006 | Bright et al. | |
| 7,065,301 B2 | 6/2006 | Shastri et al. | |
| 7,066,879 B2 | 6/2006 | Fowler et al. | |
| 7,071,594 B1 | 7/2006 | Yan et al. | |
| 7,071,931 B2 | 7/2006 | Tegreene et al. | |
| 7,078,378 B1 | 7/2006 | Owen et al. | |
| 7,079,726 B2 * | 7/2006 | Schroeder | 385/18 |
| 7,091,647 B2 * | 8/2006 | Jerman | 310/309 |
| 7,098,571 B2 * | 8/2006 | Adams et al. | 310/309 |
| 7,108,656 B2 | 9/2006 | Fujikawa et al. | |
| 7,112,302 B2 | 9/2006 | Yoshimi et al. | |
| 7,125,128 B2 * | 10/2006 | Novak | 359/849 |
| 7,126,903 B2 | 10/2006 | Feenstra et al. | |
| 7,189,961 B2 | 3/2007 | Johnston et al. | |
| 7,190,329 B2 | 3/2007 | Lewis et al. | |
| 7,232,071 B2 | 6/2007 | Lewis et al. | |
| 7,271,383 B2 | 9/2007 | Chee | |
| 7,391,013 B2 | 6/2008 | Johnston et al. | |
| 2001/0055462 A1 | 12/2001 | Seibel | |
| 2002/0015724 A1 | 2/2002 | Yang et al. | |
| 2002/0024495 A1 | 2/2002 | Lippert et al. | |
| 2002/0050956 A1 | 5/2002 | Gerhard et al. | |
| 2002/0075284 A1 | 6/2002 | Rabb, III | |
| 2002/0088925 A1 | 7/2002 | Nestorovic et al. | |
| 2002/0115922 A1 | 8/2002 | Waner et al. | |
| 2002/0141026 A1 | 10/2002 | Wiklof et al. | |
| 2002/0158814 A1 | 10/2002 | Bright et al. | |
| 2002/0163484 A1 | 11/2002 | Furness, III et al. | |
| 2002/0167462 A1 | 11/2002 | Lewis et al. | |
| 2002/0171776 A1 | 11/2002 | Tegreene et al. | |
| 2002/0171937 A1 | 11/2002 | Tegreene et al. | |
| 2003/0016187 A1 | 1/2003 | Melville et al. | |
| 2003/0030753 A1 | 2/2003 | Kondo et al. | |
| 2003/0032143 A1 | 2/2003 | Neff et al. | |
| 2003/0034709 A1 * | 2/2003 | Jerman | 310/209 |
| 2003/0058190 A1 | 3/2003 | Lewis et al. | |
| 2003/0086172 A1 | 5/2003 | Urey | |
| 2003/0092995 A1 | 5/2003 | Thompson | |
| 2003/0130562 A1 | 7/2003 | Barbato et al. | |
| 2003/0142934 A1 | 7/2003 | Pan et al. | |
| 2003/0159447 A1 | 8/2003 | Sergio et al. | |
| 2003/0214460 A1 | 11/2003 | Kovacs | |
| 2003/0216729 A1 | 11/2003 | Marchitto et al. | |
| 2004/0004585 A1 | 1/2004 | Brown et al. | |
| 2004/0057103 A1 | 3/2004 | Bernstein | |
| 2004/0075624 A1 | 4/2004 | Tegreene et al. | |
| 2004/0076390 A1 | 4/2004 | Dong Yang et al. | |
| 2004/0085261 A1 | 5/2004 | Lewis et al. | |
| 2004/0085617 A1 | 5/2004 | Helsel et al. | |
| 2004/0087844 A1 | 5/2004 | Yen | |
| 2004/0101822 A1 | 5/2004 | Wiesner et al. | |
| 2004/0113059 A1 | 6/2004 | Kawano et al. | |
| 2004/0118821 A1 | 6/2004 | Han et al. | |
| 2004/0119004 A1 | 6/2004 | Wine et al. | |

(56) References Cited

U.S. PATENT DOCUMENTS

| | | |
|---|---|---|
| 2004/0122328 A1 | 6/2004 | Wang et al. |
| 2004/0133786 A1 | 7/2004 | Tarbouriech |
| 2004/0151466 A1 | 8/2004 | Crossman-Bosworth et al. |
| 2004/0155186 A1 | 8/2004 | Nestorovic et al. |
| 2004/0155834 A1 | 8/2004 | Wit et al. |
| 2004/0179254 A1 | 9/2004 | Lewis et al. |
| 2004/0196518 A1 | 10/2004 | Wine et al. |
| 2004/0223202 A1 | 11/2004 | Lippert et al. |
| 2004/0225222 A1 | 11/2004 | Zeng et al. |
| 2004/0236371 A1 | 11/2004 | McNally-Heintzelman et al. |
| 2004/0240866 A1 | 12/2004 | Ramsbottom |
| 2004/0252377 A1 | 12/2004 | Urey |
| 2004/0254474 A1* | 12/2004 | Seibel et al. .................. 600/473 |
| 2005/0010787 A1 | 1/2005 | Tarbouriech |
| 2005/0014995 A1 | 1/2005 | Amundson et al. |
| 2005/0020877 A1 | 1/2005 | Ishihara et al. |
| 2005/0020926 A1 | 1/2005 | Wiklof et al. |
| 2005/0023356 A1 | 2/2005 | Wiklof et al. |
| 2005/0030305 A1 | 2/2005 | Brown et al. |
| 2005/0038322 A1 | 2/2005 | Banik |
| 2005/0116038 A1 | 6/2005 | Lewis et al. |
| 2005/0143664 A1* | 6/2005 | Chen et al. .................. 600/478 |
| 2005/0162762 A1* | 7/2005 | Novak .......................... 359/849 |
| 2005/0187441 A1 | 8/2005 | Kawasaki et al. |
| 2005/0203343 A1 | 9/2005 | Kang et al. |
| 2005/0240147 A1 | 10/2005 | Makower et al. |
| 2006/0010985 A1 | 1/2006 | Schneider |
| 2006/0084867 A1 | 4/2006 | Tremblay et al. |
| 2006/0164330 A1 | 7/2006 | Bright et al. |
| 2006/0173480 A1* | 8/2006 | Zhang .......................... 606/185 |
| 2006/0183246 A1 | 8/2006 | Wiesner et al. |
| 2006/0195014 A1 | 8/2006 | Seibel et al. |
| 2006/0238774 A1 | 10/2006 | Lindner et al. |
| 2006/0245971 A1 | 11/2006 | Burns et al. |
| 2006/0284790 A1 | 12/2006 | Tegreene et al. |
| 2007/0038119 A1 | 2/2007 | Chen et al. |
| 2007/0046778 A1 | 3/2007 | Ishihara et al. |
| 2007/0135770 A1 | 6/2007 | Hunt et al. |
| 2007/0156021 A1 | 7/2007 | Morse et al. |
| 2007/0161876 A1 | 7/2007 | Bambot et al. |
| 2007/0162093 A1 | 7/2007 | Porter et al. |
| 2007/0167681 A1 | 7/2007 | Gill et al. |
| 2007/0173707 A1 | 7/2007 | Mitra |
| 2007/0179366 A1 | 8/2007 | Pewzner et al. |
| 2007/0197874 A1 | 8/2007 | Ishihara |
| 2007/0197875 A1 | 8/2007 | Osaka |
| 2007/0203413 A1 | 8/2007 | Frangioni |
| 2007/0213588 A1 | 9/2007 | Morishita et al. |
| 2007/0213618 A1 | 9/2007 | Li et al. |
| 2007/0225695 A1 | 9/2007 | Mayer et al. |
| 2007/0238930 A1 | 10/2007 | Wiklof et al. |
| 2007/0244365 A1 | 10/2007 | Wiklof |
| 2007/0260121 A1 | 11/2007 | Bakos et al. |
| 2007/0260273 A1 | 11/2007 | Cropper et al. |
| 2008/0058629 A1 | 3/2008 | Seibel et al. |

FOREIGN PATENT DOCUMENTS

| | | |
|---|---|---|
| EP | 1716802 | 11/2006 |
| EP | 1747751 | 1/2007 |
| EP | 1797813 | 6/2007 |
| JP | 2007-244590 | 9/2007 |
| JP | 2007-244680 | 9/2007 |
| WO | WO 98/13720 | 4/1998 |
| WO | WO 99/18456 | 4/1999 |
| WO | 99/58930 | 11/1999 |
| WO | 00/13210 | 3/2000 |
| WO | 01/10322 | 2/2001 |
| WO | 01/60274 | 8/2001 |
| WO | 02/062239 | 8/2002 |
| WO | WO 03/069380 | 8/2003 |
| WO | 03/088643 | 10/2003 |
| WO | 03/098918 | 11/2003 |
| WO | 03/101287 | 11/2003 |
| WO | 2006/020605 | 2/2006 |
| WO | WO 2006/049787 | 5/2006 |
| WO | WO 2006/055733 | 5/2006 |
| WO | 2007/041542 | 4/2007 |
| WO | 2007/070831 | 6/2007 |
| WO | WO 2007/067163 | 6/2007 |
| WO | WO 2007/084915 | 7/2007 |

OTHER PUBLICATIONS

Invitation to Pay Additional Fees with Partial International Search Report, PCT/US2008/074273 (Dec. 30, 2008).
Kiang, M-H et al., "Surface-Micromachined Electrostatic-Comb Driven Scanning Micromirrors for Barcode Scanners" (date of first publication unknown).
Lewis, J.R. et al., "Scanned beam medical imager," MOEMS Display and Imaging Systems II, Proceedings of SPIE vol. 5348, pp. 40-51 (2004).
James, R. et al., "Update on MEMS-based Scanned Beam Imager" (date of first publication unknown).
Wiklof, C., "Display technology spawns laser camera," Laser Focus World (Dec. 2004).
"Press Information—Phillips' Fluid Lenses Bring Things into Focus," http://www.newscenter.philips.com (Mar. 3, 2004).
Lettice, J., "The $5 'no moving parts' fluid zoom lens—twice," The Register (Mar. 15, 2004).
"Volcano Products—IVUS Imaging Visions® PV018," http://www.volcanotherapeutics.com (date of first publication unknown).
Barhoum, E.S. et al., "Optical modeling of an ultrathin scanning fiber endoscope, a preliminary study of confocal versus non-confocal detection," Optics Express, vol. 13, No. 19, pp. 7548-7652 (Sep. 19, 2005).
"Crystalplex Technology—PlxBead™ Superior Qualities," http:www-ww.crystalplex.com (date of first publication unknown).
"Microvision [illuminating information] Products/Overview, Corporate Overview Presentation 2006" (2006).
"Holographic Beam Combiner for Ladar, Printer, Fiber Optics, and Cancer Treatment," by Digital Optics Technologies, Inc., http://www.mdatechnology.net (date of first publication unknown).
Brown, D.M., Abstract from SPIE Digital Library for "High-power laser diode beam combiner," Optical Engineering, vol. 42, Issue 11 (2003).
Literature entitled "All fiber beam combiner from Point Source" (Oct. 13, 2006).
"Custom Polarzing Cube Beamsplitters," from GlobalSpec The Engineering Search Engine, http://www.globalspec.com (date of first publication unknown).
Literature entitled "Dallas Semiconductor MAXIM—Visible-Laser Driver has Digitally Controlled Power Modulation," by Maxim Integrated Products, http://www.maxim-ic.com (Jul. 1, 2001).
"SCAN Mode Strategies for SCUBA-2" (May 25, 2005).
Seifert, M. et al., "High Power Diode Laser Beam Scanning in Multi-Kilowatt Range," Proceedings of the 23rd International Congress on Applications of Lasers and Electro-Optics (2004).
Jutzi, B. et al., "Sub-Pixel Edge Localization Based on Laser Waveform Analysis," ISPRS WG III/3, III/4, V/3 Workshop "Laser scanning 2005," Enschede, the Netherlands (Sep. 12-14, 2005).
"Bladeless Trocars," by Johnson & Johnson, http://www.jnjgateway.com (date of first publication unknown).
Yeh, R. et al., "Microelectromechanical Components for Articulated Microrobots" (date of first publication unknown).
Xu, Q. et al., "Micrometre-scale silicon electro-optic modulator," Nature, vol. 435, pp. 325-327 (May 19, 2005).
Park, H. et al., "Development of Double-Sided Silicon Strip Position Sensor," 2005 IEEE Nuclear Science Symposium Conference Record, pp. 781-785 (2005).
Hammond, S.W., "Architecture and Operation of a Systolic Sparse Matrix Engine," Proceedings of the 3rd SIAM Conference on Parallel Processing for Scientific Computing, pp. 419-423 (1987).
PCT, International Search Report and Written Opinion, International Application No. PCT/US2007/078868 (Mar. 28, 2008).

(56) References Cited

OTHER PUBLICATIONS

PCT, International Search Report, PCT/US20081056589 (Jul. 30, 2008).
PCT, International Search Report, PCT/US2008/059231 (Jul. 4, 2008).
PCT, International Search Report, PCT/US20071087923 (May 21, 2008).
PCT, International Search Report, PCT/US2008/056596 (Jun. 23, 2008).
PCT, International Search Report, PCT/US2008/059235 (Jul. 14, 2008).
PCT, International Search Report, PCT/US2007/087930 (Jul. 3, 2008).
PCT, International Search Report, PCT/US2008/051274 (Jul. 18, 2008).
PCT, International Search Report, PCT/US2008/066552 (Oct. 23, 2008).
Ra, H. et al., "Biomedical Optics & Medical Imaging—Microtechnology enables endoscopic confocal microscopy," SPIE (http://spie.org) (2007).
International Search Report issued regarding International Application No. PCT/US2007/078868 (Mar. 28, 2008).

* cited by examiner

MICRO-ELECTROMECHANICAL DEVICE

FIELD OF THE INVENTION

The present application relates generally to mechanical systems and more particularly to a micro-electromechanical device including moveable member.

BACKGROUND OF THE INVENTION

Micro-electromechanical systems (MEMS) generally refer to mechanical components on the micrometer size and include three-dimensional lithographic features of various geometries. They may be manufactured using planar processing similar to semiconductor processes such as surface micromachining. MEMS devices typically range in size from a micrometer to a millimeter.

MEMS devices often include one or more components that move. These moveable components may include a hinge or other connection that is fragile and susceptible to damage. Electrostatic drive systems, which are frequently employed to move components of the MEMS devices, often rely on a voltage difference between closely spaced-apart components. For example, a comb drive is a linear motor that utilizes electrostatic forces. The comb drive takes its name from its resemblance to two hair combs lying in a plane and arranged so that their teeth are interleaved. The tooth spacing and size allows a potential difference (e.g., voltage) to be applied between the combs, and some relative motion between them. The electrostatic force between the combs cause them to move toward each other.

Large accelerations (i.e., shocks) of the MEMS device may cause components, particularly the moveable components, to collide with adjacent components, which may cause damage to the MEMS device. It is desirable to provide structure that can be used to protect moveable components from damage due to large accelerations, for example, during transport (e.g., shipping) of the MEMS device or even during use.

SUMMARY OF THE INVENTION

In an aspect, a micro-electromechanical device includes a frame, a moveable member movably connected to the frame such that the moveable member is capable of movement relative to the frame and drive system for use in moving the moveable member relative to the frame. A braking system is provided that inhibits movement of the moveable member relative to the frame.

In another aspect, a medical device configured to be inserted into a patient's body includes a micro-electromechanical scanning device for optical scanning of a field of view within the patient's body. The micro-electromechanical scanning device includes a frame and a scanning member movably connected to the frame such that the scanning member is capable of movement relative to the frame. The scanning member is configured to direct light across a field-of-view. A drive system is configured to move the scanning member relative to the frame and a braking system is provided that inhibits movement of the moveable scanner relative to the frame.

In another aspect, a method of controlling a micro-electromechanical device including a frame and a moveable member capable of movement relative to the frame is provided. The method include detecting an acceleration of the micro-electromechanical device. A signal is generated indicative of the acceleration. Movement of the moveable member is inhibited relative to the frame based on the signal.

The details of one or more embodiments of the invention are set forth in the accompanying drawings and the description below. Other features, objects, and advantages of the invention will be apparent from the description and the drawings, and from the claims.

DETAILED DESCRIPTION OF THE INVENTION

Figure 1:
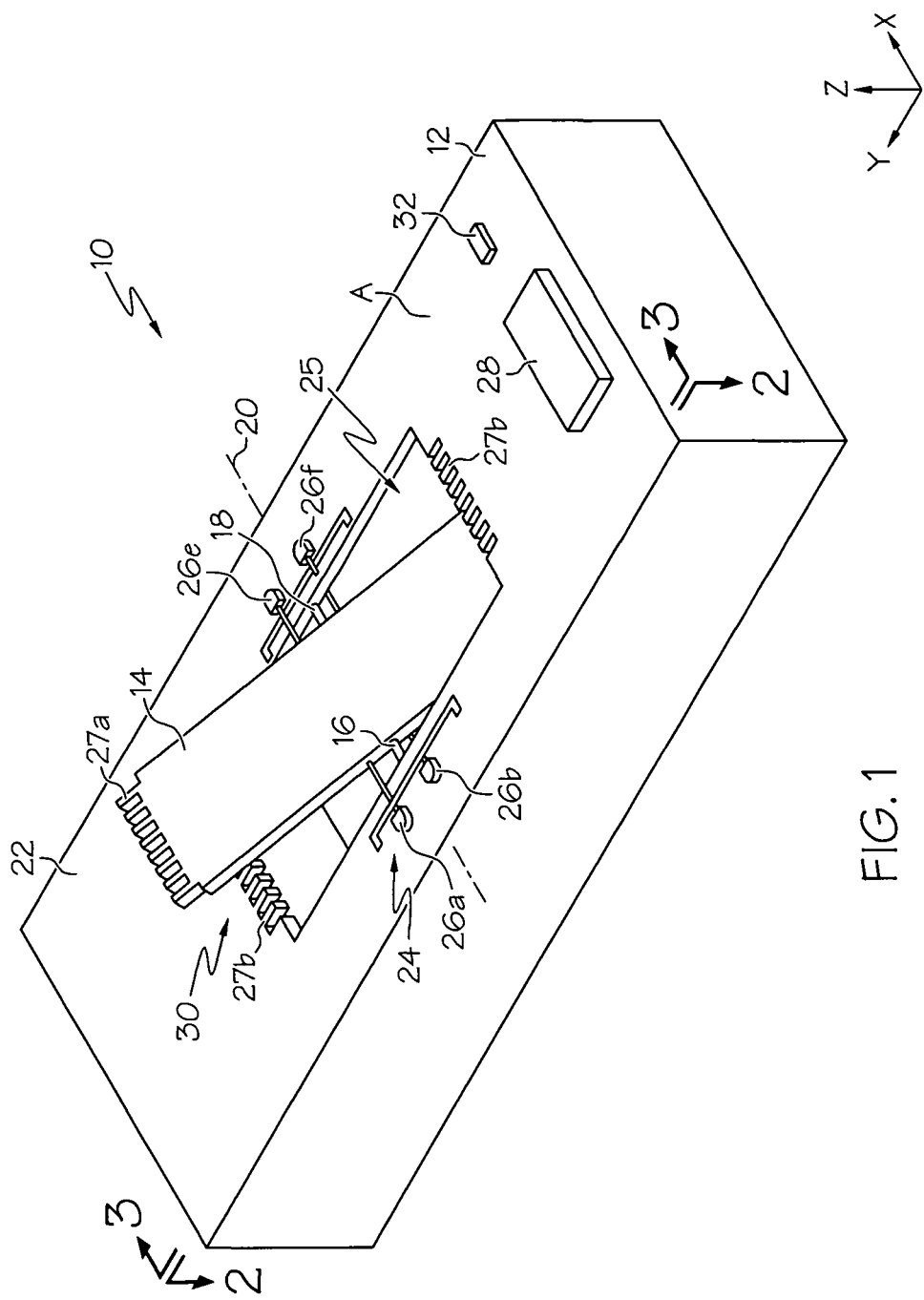
FIG. 1 is an unscaled, schematic perspective view of an embodiment of a MEMS device including moveable member.

Referring to FIG. 1, a schematic representation of a microelectromechanical (MEMS) device 10 (such as a scanner of a scanned beam imager) includes a frame 12 and a moveable member 14 that is supported by the frame. The moveable member 14 is connected to the frame 12 at joints or flexures 16 and 18 that are aligned to form a pivot axis 20 for the moveable member. As can be seen by the illustration, flexures 16 and 18 allow the moveable member 14 to pivot or rotate into and out of plane A formed by substantially planar surface 22. Driving structures (such as the illustrated electrostatic driving combs 30 or a magnetic form) is used to move the moveable member 14. A controller 28 controls operation of the driving combs 30 and thus movement of the moveable member 14. While controller 28 is shown carried by the frame 12, the controller may be separate from the frame, for example, mounted to a common support structure (not shown).

As can be seen, a small gap 25 (see also FIG. 2) is provided between the moveable member 14 and the frame 12 to allow the moveable member to move freely throughout its intended range of motion. Additionally, teeth 27a and 27b of the driving combs 30 are, at times, maintained spaced-apart by a very small distance. To inhibit movement of the moveable member 14 (e.g., unintended or otherwise within and/or out of plane A) and to reduce the probability of collisions between components, a braking system 24 is included. Braking system 24 includes multiple braking components 26a-26h mounted to the frame 12 that are capable of contacting the moveable member 14 to inhibit movement (e.g., movement in the x, y, z directions and/or rotational movement) thereof relative to the frame 12. Actuation of the braking components 26a-26h can be controlled by the controller 28 in response to an input. The term "braking" as used herein refers generally to inhibiting movement such as stopping movement, slowing movement and/or bracing or constraining from movement (i.e., to hold steady).

An accelerometer 32 (e.g., linear and/or rotational) is provided that is capable of generating a signal or signals responsive to acceleration. In some embodiments, the accelerometer 32 is mounted to the frame 12 or, alternatively, the frame and accelerometer may be mounted to a common support structure (not shown). Accelerometer 32 provides a signal to the controller 28 which, in turn, can control the braking system 24 in response to the signal from the accelerometer. Circuits to condition, amplify and/or quantify the signal may be located on the MEMS device 10 or elsewhere. As one illustrative example, if the signal provided from the accelerometer 32 to the controller 28 indicates an acceleration above a predetermined threshold value in any one or more of the x, y and/or z directions, the controller may engage the braking system 24 to inhibit movement of the moveable member 14 relative to the frame 12. Of course, other examples are possible, some of which are described below.

Figure 2:
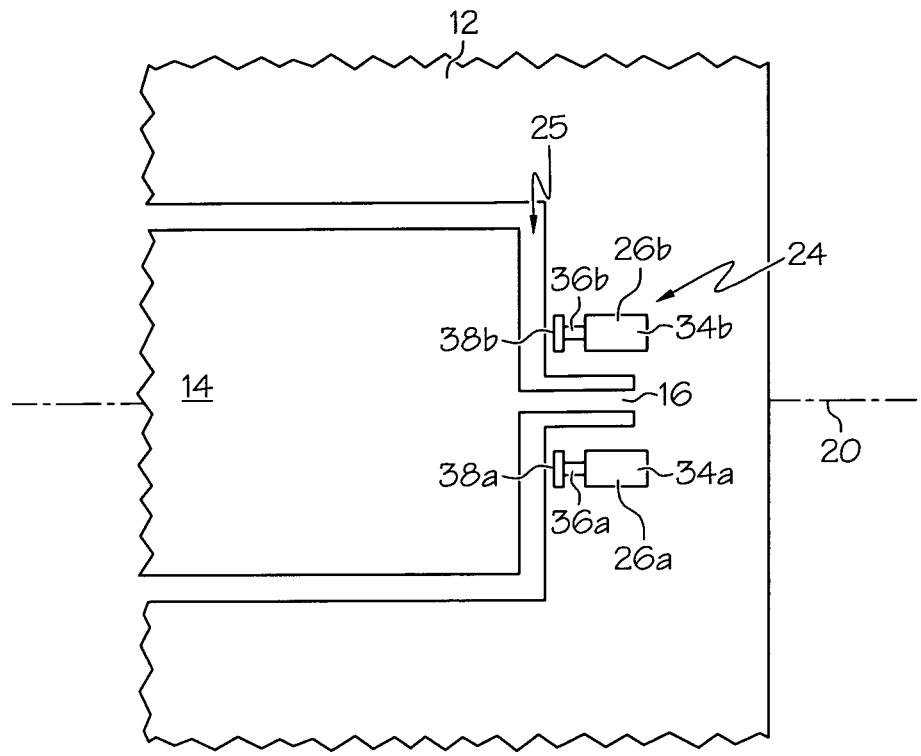
FIG. 2 is a partial top view of the MEMS device of FIG. 1.
Figure 3:
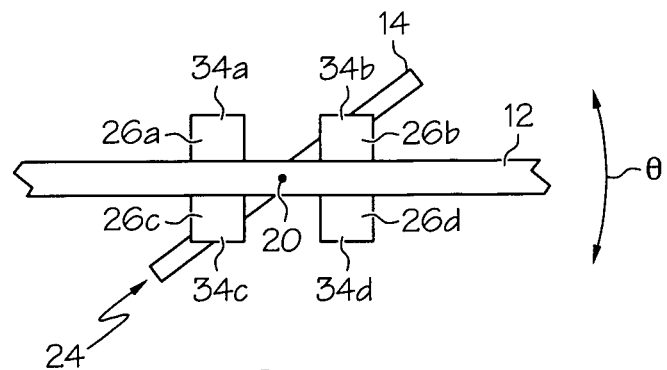
FIG. 3 is a partial section side view of the MEMS device of FIG. 1.

Referring now to FIGS. 2 and 3, braking components 26a-26h are shown as linear actuators each including a cylinder 34 and a piston 36 partially disposed within a bore of the cylinder. For simplicity, only actuators 26a-26d are shown. Piston 36 is capable of moving relative to the cylinder 34 between retracted (e.g., non-contact with the moveable member 14; see, e.g., actuator 26f) and extended (e.g., in contact with the moveable member; see, e.g., actuator 26a) positions. The piston 36 is moved using a material phase change. For example, for a steam-driven actuator 26, water disposed in the cylinder 34 may be vaporized by application of an electric current (e.g., controlled using controller 28) to a heater, which causes the piston 36 to extend. After the current is removed, condensation and capillary forces may cause the piston 36 to retract from the extended position into the cylinder 34. Other suitable phase change materials include other liquids, e.g., having higher viscosities and/or lower boiling points than water, and waxes, e.g., that exhibit expansion upon melting. Use of higher viscosity materials or a solid/liquid phase change can reduce the probability of unintended material leak from the cylinder 34.

Referring particularly to FIG. 2, the pistons 36 include a pad 38. Pad 38 is located at a free end of the piston 36 to contact or be capable of contacting and immobilizing the moveable member 14 with the piston in the extended position. Pad 38 may be formed of a different material than that forming the piston 36. In some embodiments, pad 38 may be formed of a material having a higher coefficient of friction against the moveable member 14 and/or a softer or more compliant material than that forming the piston 36 and frame 12. In another embodiment, pad may be formed of a material that is harder than that forming the frame 12. Suitable exemplary materials for forming the pad 38 include elastomers (various rubber materials) and plastics (such as parylene, which would be compatible with typical MEMS processing methods) if a strong interaction is desired, or metals (e.g., nickle, chrome, titanium), amorphous diamonds, etc., which may provide reduced friction against the material of the moving element 14 and less aggressive braking action.

Referring again to FIGS. 2 and 3, the actuators 26a-26d (and actuators 26e-26h) are preferably, although not necessarily, symmetrically disposed about the pivot axis 20 to balance the moments which may arise during actuation of the braking system 24. Additionally, the braking forces applied by the actuators 26a-26h are in a direction where the moveable member 14 has the least compliance, in other words, a stiff direction, which, in the illustrated embodiment, is in the direction of the pivot axis 20. Applying the braking forces in the direction of least compliance can result in the MEMS device 10 being less sensitive to variations in actuation force and actuation times of the multiple actuators 26a-26h.

The actuators 26a-26h and associated pads 38 can be sized and located to intercept or otherwise contact the moveable member 14 at any point during its intended travel θ. The actuators 26a-26h can be mounted near to a point of minimum excursion, so that a size of the braking elements can be minimized while still intercepting the moveable element 14 at any position along its intended travel. In the illustrated embodiment, a point of minimum excursion is near the pivot axis 20. This can allow the controller 28 to actuate the braking system 24 without any need to synchronize the actuation of the braking system to location of the moveable member 14.

Figure 4:
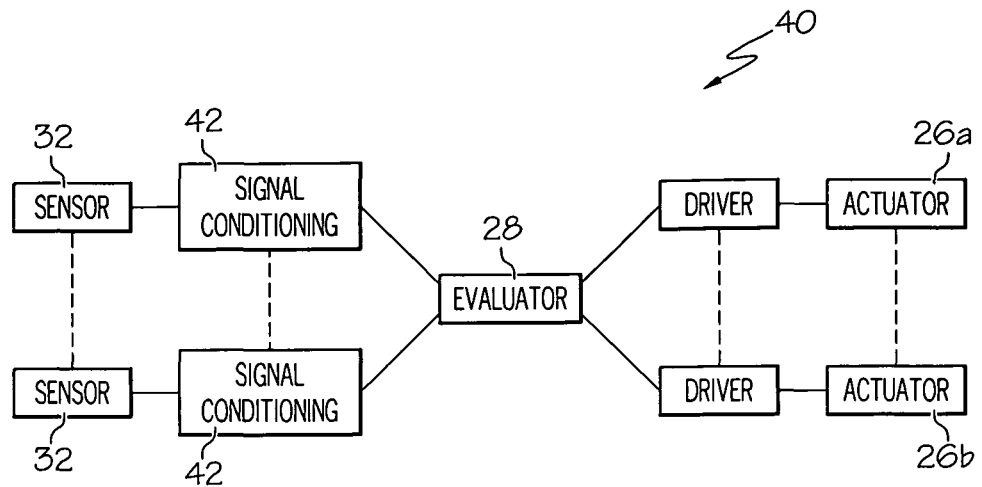
FIG. 4 is a diagram of an embodiment of a control system.

Referring now to FIG. 4, a control system 40 including the actuators 26 is shown. Control system 40 includes one or more of the sensors 32 (e.g., accelerometers) connected to signal conditioning electronics 42. In some embodiments, there are multiple sensors 32 disposed in each of three orthogonal planes to allow for resolution of angular and translational accelerations of the MEMS device 10. The position of the movable member 14 may also be measured. An evaluator 41 receives the output signals from the sensors 32, determines the severity of the acceleration or shock in one or more of the various axes independently based on the output signals and determines, based on the severity and, in some instances, position of the moveable member 14, which of the actuators 26 should be actuated. The evaluator 41 may be part of or otherwise capable of communicating with the controller 28. Additional sensors may be employed, for example, for redundancy or to achieve a wider dynamic range, some being of high sensitivity (i.e., being responsive to lower accelerations) and others being of low sensitivity (i.e., being responsive to only higher accelerations). In some embodiments, it may be desirable to include only enough sensors 32 for sensing accelerations in "weaker" directions, i.e., those directions in which an acceleration is more likely to cause damage to the MEMS device 10. The term directions includes rotational as well as linear degrees of freedom.

Figure 5:
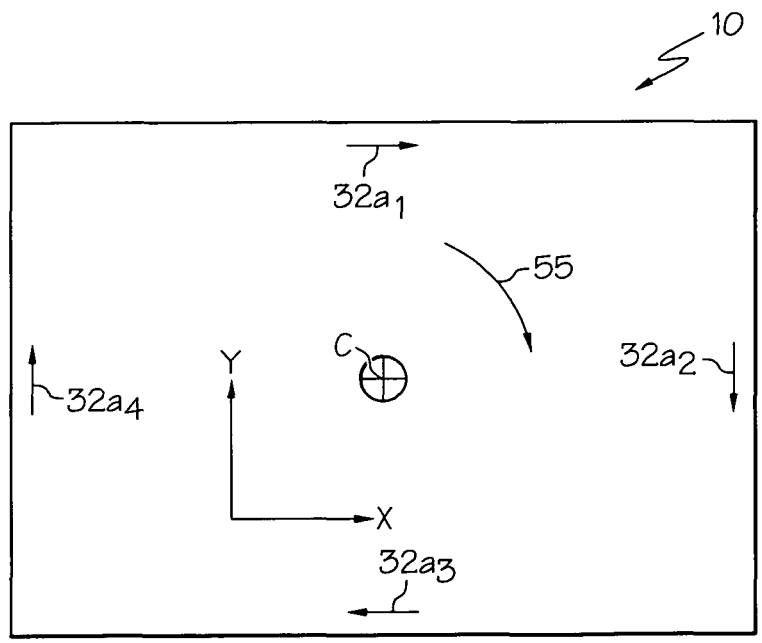
FIG. 5 is a diagrammatic view of an embodiment of an accelerometer placement scheme.

FIG. 5 illustrates an exemplary accelerometer placement schematic. Four accelerometers $32a_1$-$32a_4$ are perpendicular to each other taken in pairs. The signals generated by the accelerometers 32 are proportional to acceleration along their sensitive axes represented, in part, by the arrows because the respective accelerometers are also sensitive to movement in the direction opposite the arrows. The arrows show the direction of acceleration for which the respective accelerometer $32a_1$-$32a_4$ will give a positive output. In some embodiments, only three accelerometers 32 may be used, for example, with their signals weighted differently in combination. An exemplary accelerometer is an ADXL103 accelerometer, commercially available from Analog Devices, Inc., which is a high accuracy, high stability, low power, complete single axis iMEMS® accelerometer with a signal conditioned voltage output, on a single monolithic IC.

A signal responsive to linear acceleration of the MEMS device 10 may be obtained by the evaluator 41 using the pairwise value difference obtained from opposite accelerometers $32a_1$ and $32a_3$, $32a_2$ and $32a_4$. For example, obtaining the signal value from accelerometer $32a_3$ and subtracting it from the signal value obtained from accelerometer $32a_1$ will result in a positive signal value with the MEMS device 10 traveling to the right. Additionally, a signal may be derived which is responsive to rotation by adding all accelerometers $32a_1$-$32a_4$ signal values with the same phase or polarity. An angular acceleration about the geometric center C of the MEMS device 10 in the direction of arrow 55 will result in all accelerometers $32a_1$-$32a_4$ providing a positive signal value. The instantaneous center of angular rotation may be determined from the relative magnitudes of the signals.

MEMS device 10 may be more sensitive to shocks in one direction than in another or more sensitive to rotational shocks than linear shocks. This movement of most sensitivity may be predetermined and saved in memory to be accessible by the controller 28 and/or evaluator 41. The four signal values obtained using the layout of FIG. 5 from linear accelerometers $32a_1$-$32a_4$ can be received by the evaluator 41 which is capable of combining the signals to determine the acceleration in the MEMS device's most sensitive direction (which might not be aligned with the axes sensed). The evaluator 41 may also be capable of determining any combination of rotational and linear accelerations that could be damaging. When some predetermined threshold is detected, the controller 28 activates the braking system 24 to prevent or reduce the possibility of damage to the MEMS device 10.

Figure 6:
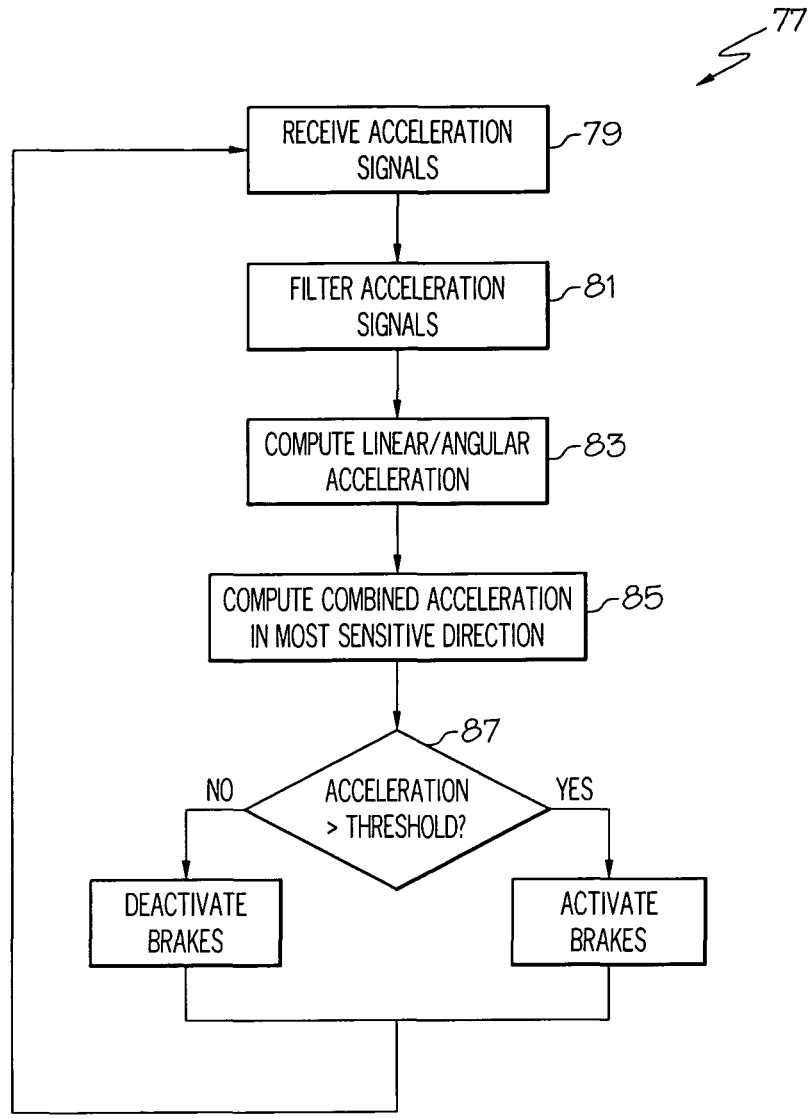
FIG. 6 is a method of brake actuation based on acceleration signals.

Referring to FIG. 6, a method 77 of activating and deactivating the braking components of the braking system 24 includes receiving acceleration signals from the sensors 32 at step 79. The acceleration signals, as described above, are indicative of acceleration of the MEMS device 10. At step 81, the signals are filtered to reduce noise and at step 83 the signals are processed to compute linear and/or angular acceleration. In some embodiments, at step 85, a combined acceleration in the most sensitive direction is computed. If the acceleration calculated at step 83 and/or 85 is greater than a predetermined threshold value at step 87, then the braking components are brought into contact with the moveable member 14. If the acceleration calculated at step 83 and/or 85 is less than or equal to the predetermined threshold, then the braking components are deactivated or remain deactivated.

Figure 7:
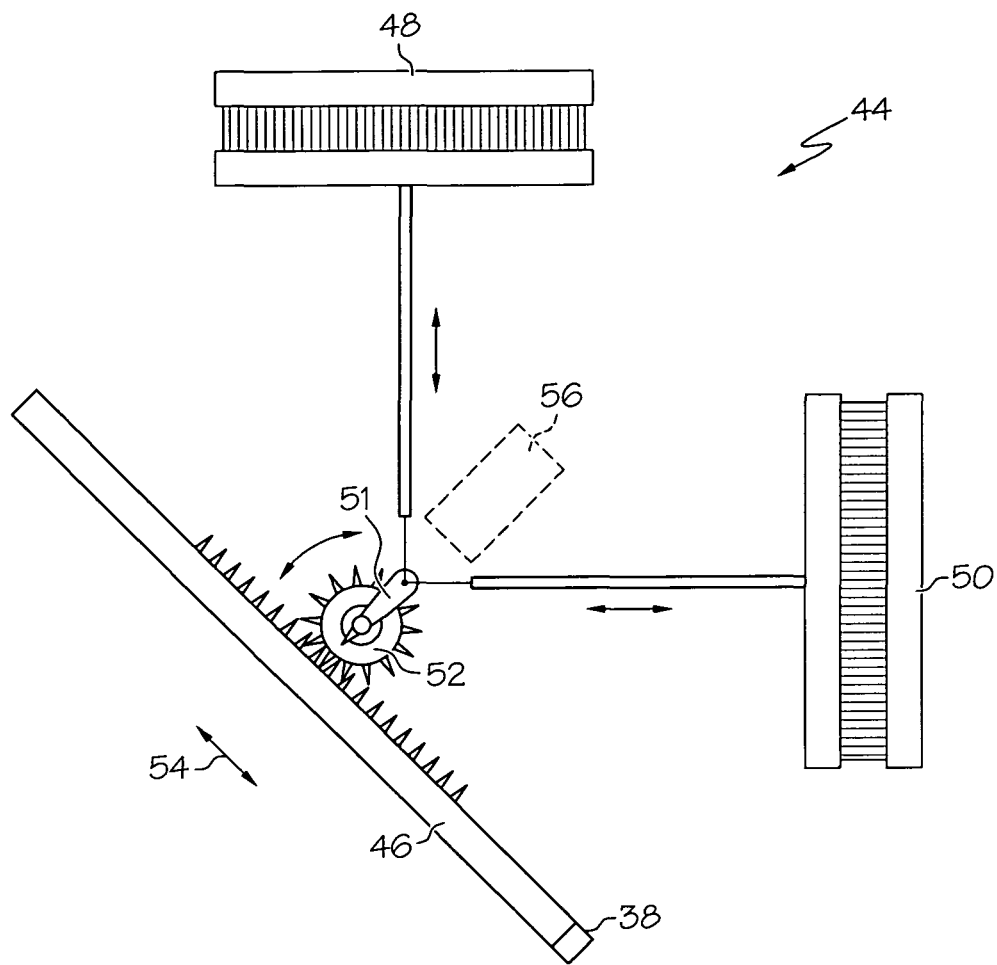
FIG. 7 is a schematic view of an embodiment of a braking system for use in braking the moveable member of the MEMS device of FIG. 1.

While piston-cylinder actuators 26 are described above, other braking systems may be used. FIG. 7 shows an alternative braking system 44 that includes a linear rack 46 driven by a pair of planar comb drives 48 and 50 linked to a drive gear 52. The drive gear 52 is meshed with the linear rack 46 such that as the comb drives 48 and 50 move toward and away from each other, the drive gear 52 rotates by means of the linkages 51 between them which moves the linear rack (e.g., using meshing teeth of the linear rack and the linkage 51) linearly in the direction of arrow 54 between retracted and extended positions. As above, the linear rack 46 may include a pad 38 located at its contacting end. Alternatively, one or more of the comb drives themselves may provide sufficient travel to engage the brake system. As an alternative to the comb drives 48 and 50 of FIG. 7, a linear electrostatic stepper motor (represented by element 56) may be used to drive the drive gear 52 or even the linear rack 46 directly. Linear electrostatic stepper motors employing gap-closing electrostatic actuators are described in Yeh R.; Kruglick E. J. J.; and Pister K. S. J., "Microelectromechanical Components for Articulated Microrobots", Proceedings of the 8th International Conference on Solid State Sensors and Actuators, Vol. 2, pp. 346-349, Stockholm, 1995, the content of which is hereby incorporated by reference as if fully set forth herein.

Figure 8:
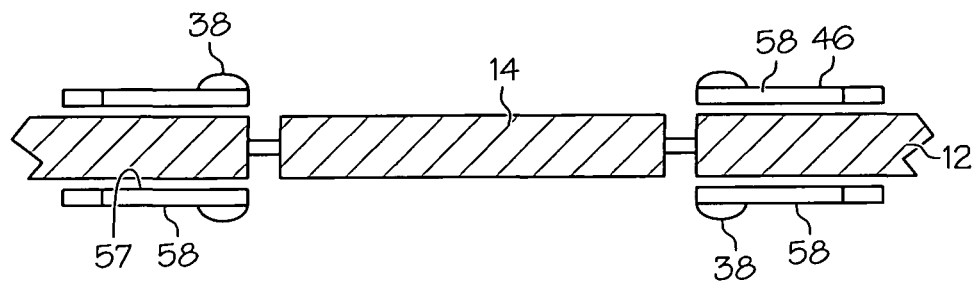
FIGS. 8 and 9 are schematic, sectional views of the braking system of FIG. 7 in retracted and extended positions, respectively.
Figure 9:
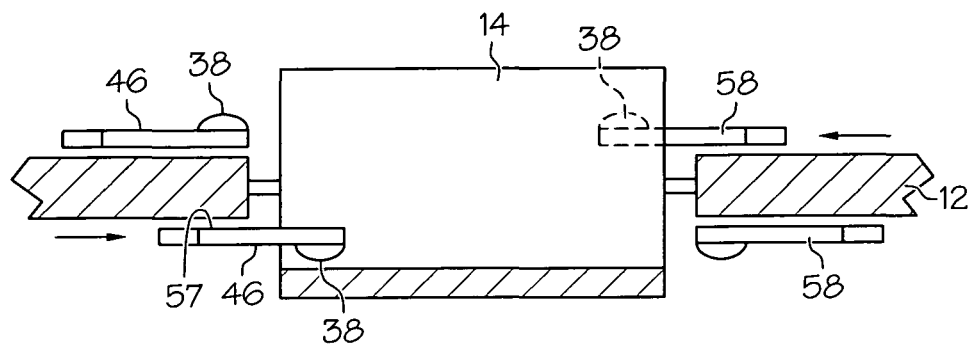

FIGS. 8 and 9 schematically represent an implementation of braking system 44 using linear racks 46 in retracted (non-braking) and extended (braking) positions, respectively. Each of the linear racks 46 include a pad 38 located on an outer surface 58 of the linear racks. In some embodiments, a pad 38 may be located at an opposite side 57 of the linear racks 46. As can be seen by FIG. 9, the linear racks 46 are located to intercept the moveable component 14 with the moveable component at a rotated position.

Figure 10:
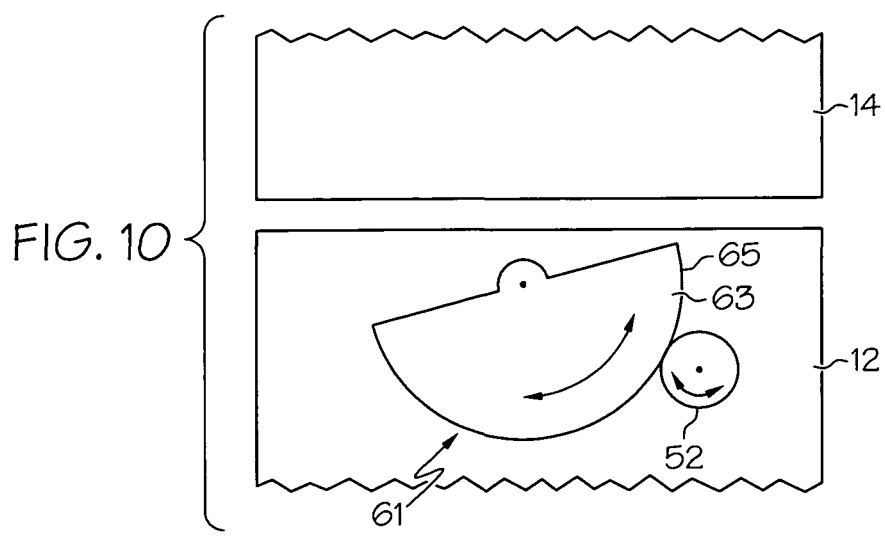
FIG. 10 is a schematic view of another embodiment of a braking system for use in braking the moveable member of the MEMS device of FIG. 1.

Referring to FIG. 10, another exemplary braking system 61 utilizes a cut-away gear 63 as a braking component. Cut-away gear 63 is rotatably mounted to the frame 12 and is driven by a drive gear 52 such that counterclockwise rotation of the cut-away gear places portion 65 into the path of the moveable member 14 to stop its movement. The drive gear 52 can be driven by comb drives or stepper motor in a fashion similar to that described above with reference to FIG. 7.

Figure 11:
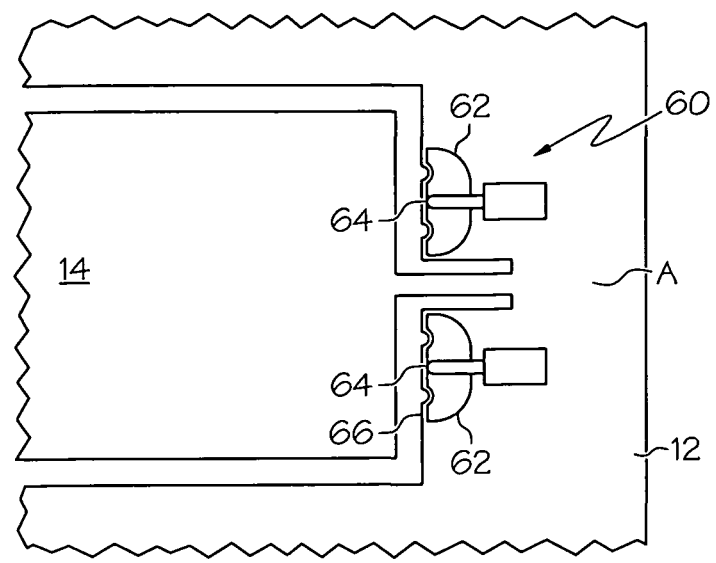
FIG. 11 is a schematic view of another embodiment of a braking system for use in braking the moveable member of the MEMS device of FIG. 1.
Figure 12:
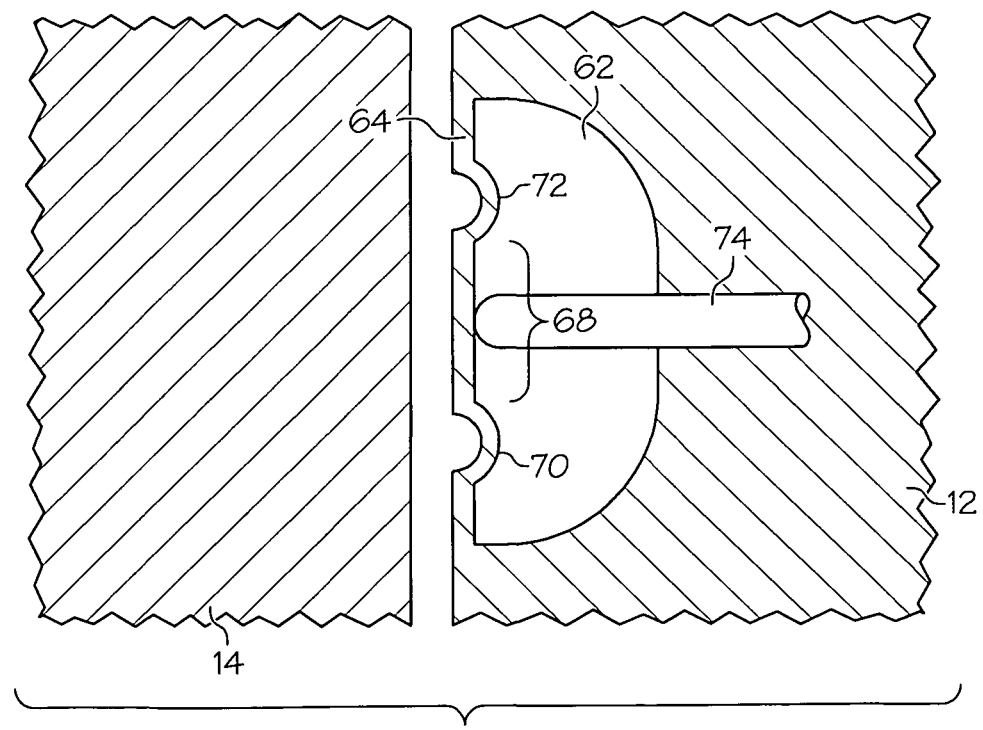
FIGS. 12 and 13 are schematic, detail views of the braking system of FIG. 11 in retracted and extended positions, respectively.

Referring now to FIGS. 11 and 12, a braking system 60 may be implemented using the frame 12 itself. Frame 12 includes an opening 62 that extends therethrough (e.g., formed by an etching process) to form a thin, flexible web 64 or ribbon (e.g., of silicon) at an edge 66 of the frame 12 facing the moveable member 14. Web 64 is relatively thin in plane A, but relatively thick in a plane orthogonal to plane A so that the web remains strong and stiff to forces out of plane A.

Referring to FIG. 12, web 64 includes a braking or blocking portion 68 located between convolutions 70 and 72 which are at opposite ends of the blocking portion. The convolutions 70 and 72 allow for geometric freedom so that the blocking portion 68 can move freely into the path of the moveable member 14. While only one convolution 70, 72 is shown at either side of the blocking portion 68, several convolutions may be employed.

As can be seen, there may be two different web thicknesses. The thickness of the web 64 at the convolutions 70 and 72 is such that sufficient flexibility is provided in the substrate from which frame 12 is made to allow deformation the web 64 in its intended form. The thickness of the blocking portion 68 is such that structural rigidity and integrity is provided while the blocking portion is in contact with the moveable member 14 as part of the braking action.

Figure 13:
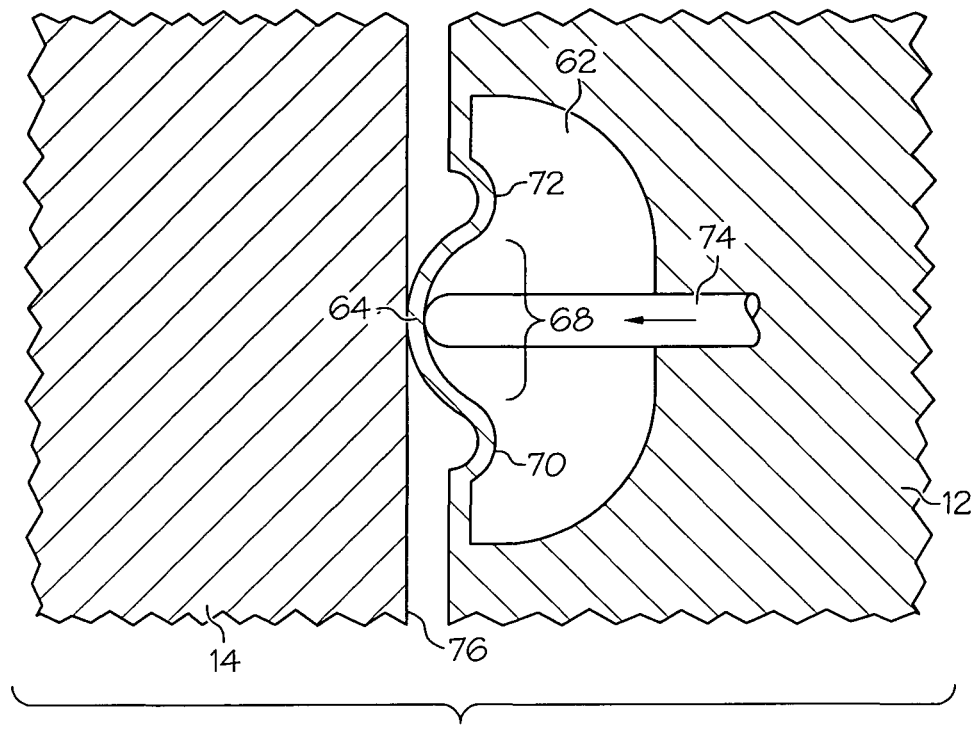

Referring also to FIG. 13, actuator 74, such as the piston-cylinder actuator 26 or the linear rack 46 described above, is used to extend (e.g., elastically) the blocking portion 68 into the path of the moveable member 14. In some instances, the blocking portion 68, once extended, may contact an edge 76 of the moveable member 14 to apply a braking force thereto, or, in other instances, the blocking portion may intercept the moveable component after it rotates. When the actuator 74 is moved to its retracted position, the blocking portion 68 of the web 64 returns toward its initial position. Web 64 may include a pad 38 located at a top, bottom and/or side 78 at the blocking portion 68 of the web.

Figure 14:
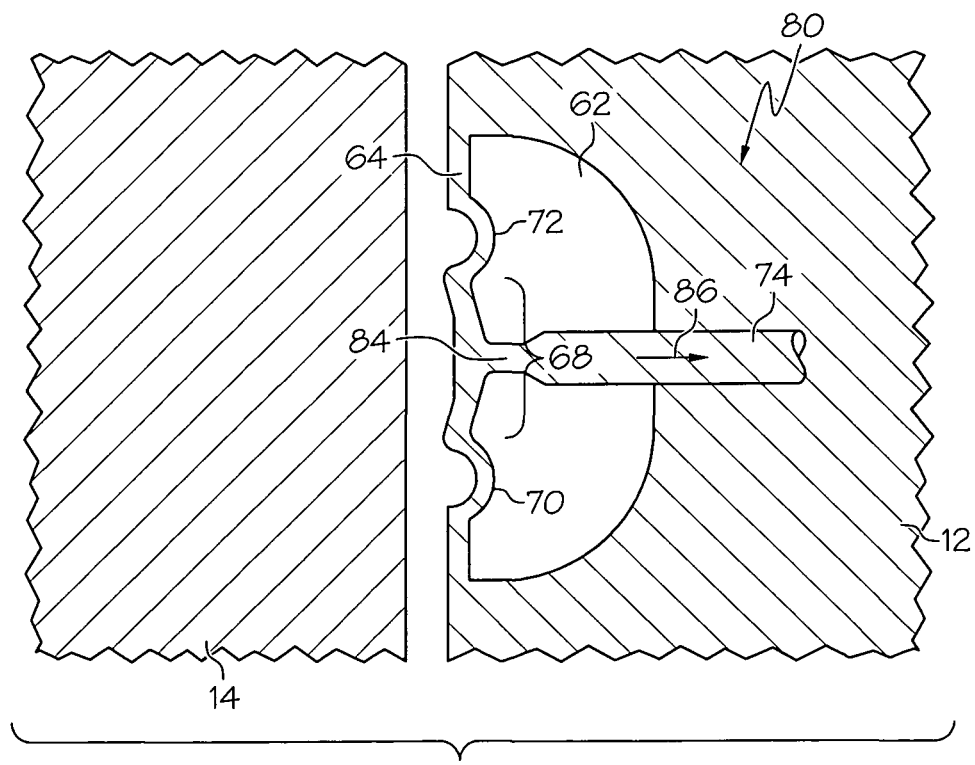
FIG. 14 is a schematic, detail view of another embodiment of a braking system.

Another exemplary braking system 80 illustrated schematically by FIG. 14 includes an actuating link 74 that is coupled to the blocking portion 68 of the web 64 by a connector 84. In this embodiment, the blocking portion 68 is biased into the path of the moveable member 14 (e.g., pre-loaded to brake the moveable member) and the actuating link 74 is used to release the braking system 80 by pulling the blocking portion 68 from the path in the direction of arrow 86 as shown.

Figure 15:
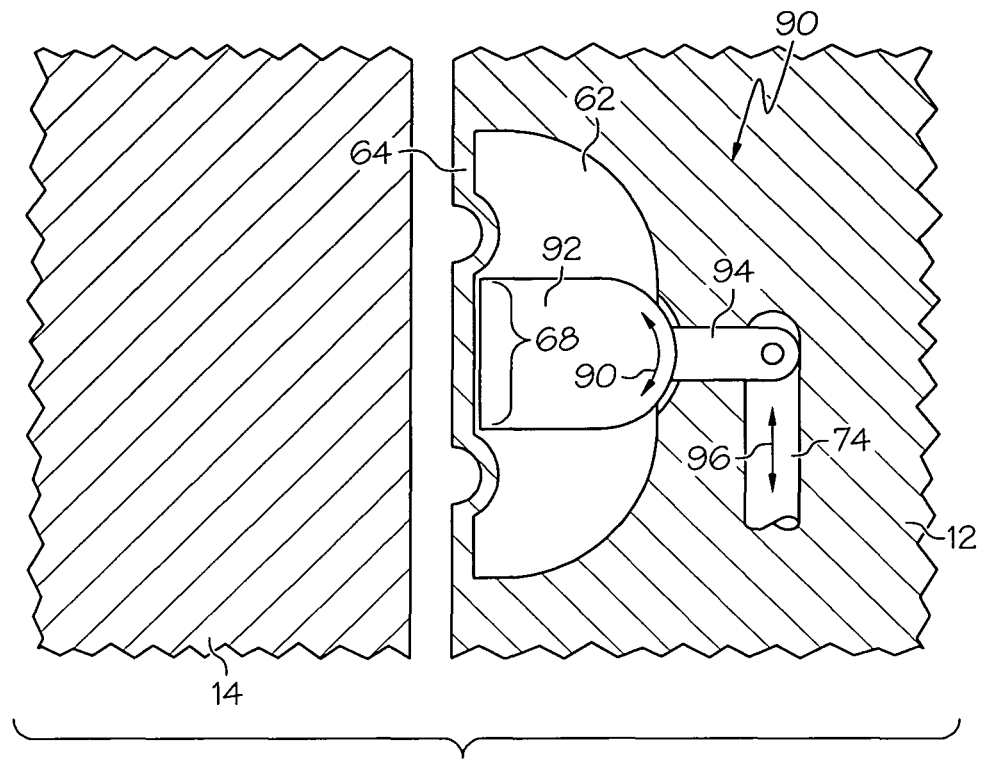
FIG. 15 is a schematic, detail view of another embodiment of a braking system.

Referring to FIG. 15, braking system 90 is cam driven and includes a cam 92 disposed in the opening 62. Cam 92 is rotated using actuating link 74 mechanically linked thereto by linkage 94. Actuating motion of the actuating link 74 in the direction of arrow 96 causes the cam 92 to rotate in the direction of arrow 98. Rotation of the cam 92 deflects the blocking portion 68 of the web 64 into the path of the moveable member 14 for a braking operation.

Figure 16:
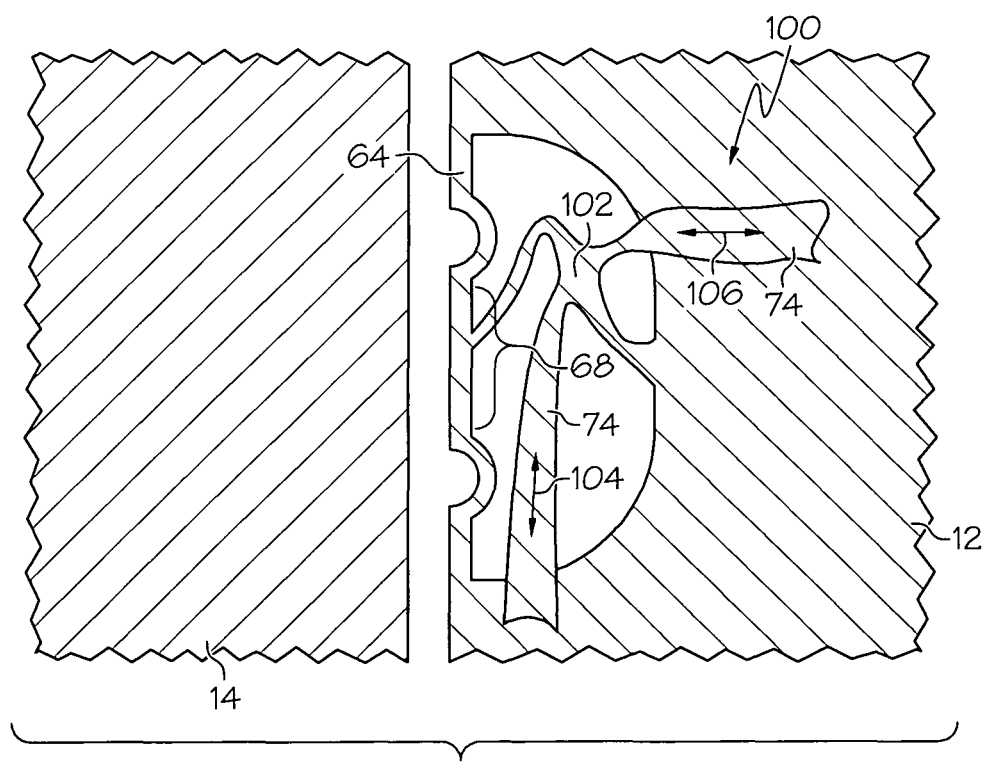
FIG. 16 is a schematic, detail view of another embodiment of a braking system.

FIG. 16 shows a braking system 100 that is toggle link driven. Braking system includes a toggle link 102 that links a pair of actuating link 74 to blocking portion 68 of the web 64. Cooperative movement of the actuating link 74 in the direction of their respective arrows 104 and 106 causes the blocking portion 68 to move into and out of the path of the moveable member 14.

Figure 17:
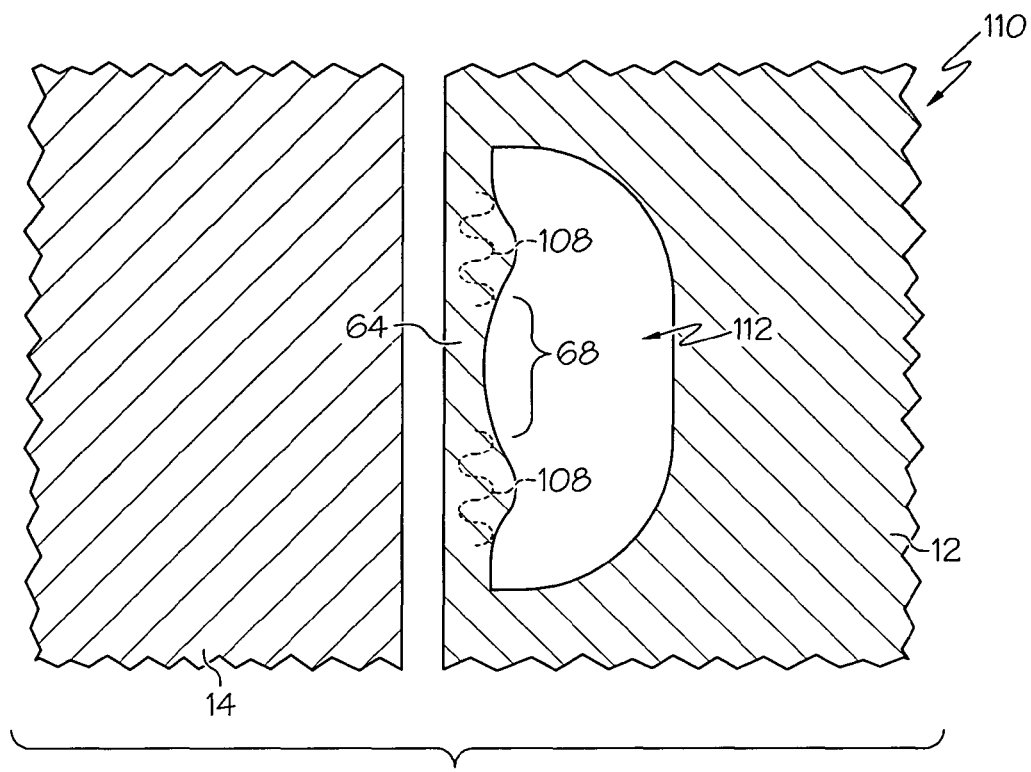
FIG. 17 is a schematic view of another embodiment of a braking system.
Figure 18:
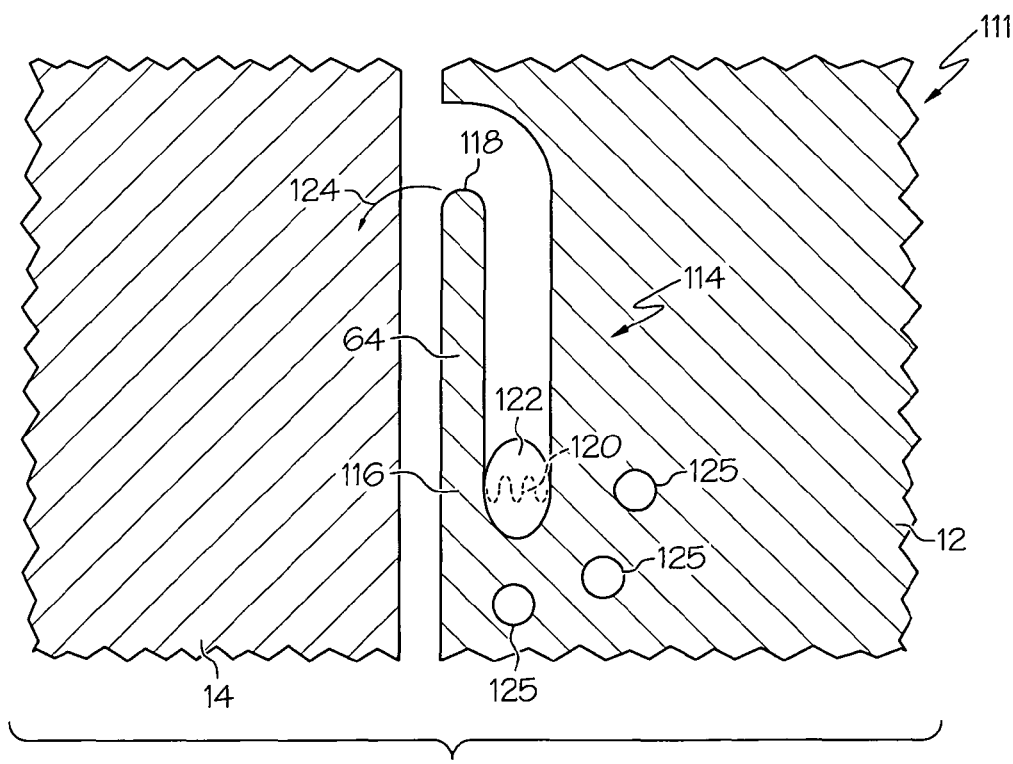
FIG. 18 is a schematic view of another embodiment of a braking system.

FIGS. 17 and 18 illustrate additional braking system configurations. Referring to FIG. 17, braking system 110 includes braking component 112, which is actuated using thermal expansion of a material. Blocking portion 68 of the web 64 is moved or extended into the path of the moveable member 14 using direct expansion. Heaters 108 are used to heat material forming the web 64, which causes the blocking portion 68 to move into the path of the moving element 14. In some embodiments, a material may be deposited on the web 64 (e.g., having a different coefficient of thermal expansion than material forming the frame 12) to aid in the expansion upon heating. Referring to FIG. 18, braking component 114 of braking system 111 includes web 64 that forms a lever having an attached end 116 and a free end 118. A heater 120 is used to heat an expanding material 122 (e.g., wax, polymer, etc.) which causes the web 64 to deflect in the direction of arrow 124 and into the path of the moveable member 14 for a braking operation. Thermal relief voids 125 help reduce heat loss to the frame 12.

Figure 19:
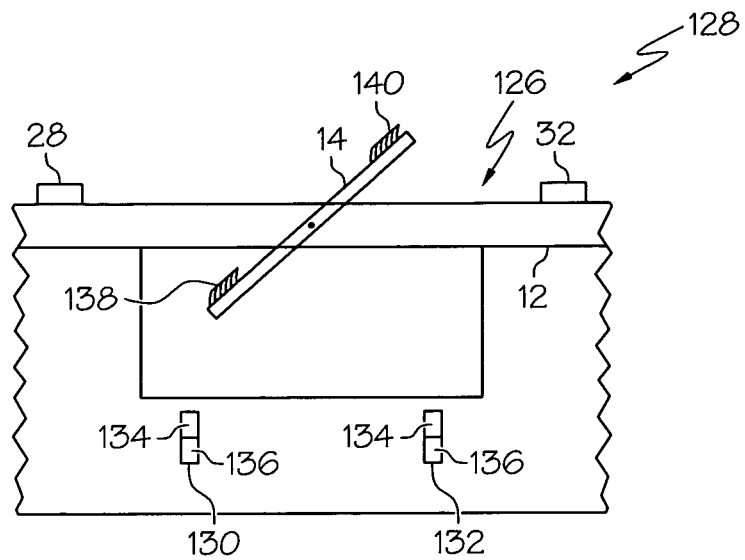
FIG. 19 is a schematic, detail view of another embodiment of a braking system for use in braking the moveable member of the MEMS device of FIG. 1.

While numerous mechanically actuated braking systems are described above, FIG. 19 schematically illustrates another exemplary braking system 126 for a MEMS device 128 including moveable component 14 that utilizes magnetic fields generated by magnetized components 130 and 132 (e.g., permanent magnets), each having a north pole 134 and a south pole 136 oriented as depicted and coils 138 and 140 carried by the moveable member 14 to brake the moveable component. The coils 138 and 140 are electrically connected to a power source (not shown) that is, for example, controlled by controller 28. In response to signals from the accelerometers 32, controller 28 controls a current running through the coils 138 and 140 to create a magnetic field that opposes the magnetic field generated by the magnetic components 130 and 132 such that movement of the moveable member 14 is inhibited. In an alternative embodiment, the moveable member 14 may carry the magnetic components 130 and 132 and the coils may be mounted to, for example, the frame 12. In an alternative embodiment, the magnetic components 130 and 132 are replaced with coils such that all of the magnetic elements are independently controlled electromagnets. All coils may contain a magnetic core (e.g., ferrite or steel) that can improve the achieved field strength.

In one embodiment, the magnetized components 130 and 132 may be formed by a single magnet (e.g., a horseshoe magnet) with, for example, one north pole located at component 130 and one south pole located at component 132. The coils 138 and 140 are patterns of metal that form a series of concentric loops on the surface of the moveable member 14. The coils 138 and 140 may be operated in two modes: passive and active. In the active mode, the coils 138 and 140 may be energized to create a small electromagnet whose poles may be aligned to attract or repel the apposing permanent magnet pole. If both poles attract or repel, the moveable member 14 will hover about some position governed by the inequality of the actual applied magnetic fields between pole pair 130, 138 and pole pair 132, 140. If one pole attracts and the other pole repels, the moveable member 14 will move to a stable position where the attracting poles will have minimal separation and the repelling poles will have maximum separation.

Figure 20:
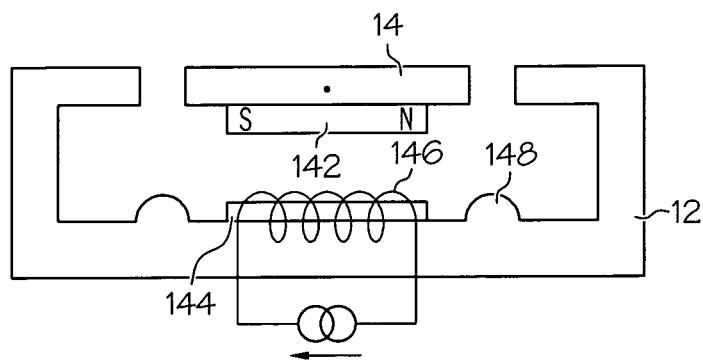
FIG. 20 is an elaborated illustration of components of another embodiment of a braking system for use in braking the moveable member of the MEMS device of FIG. 1.
Figure 21:
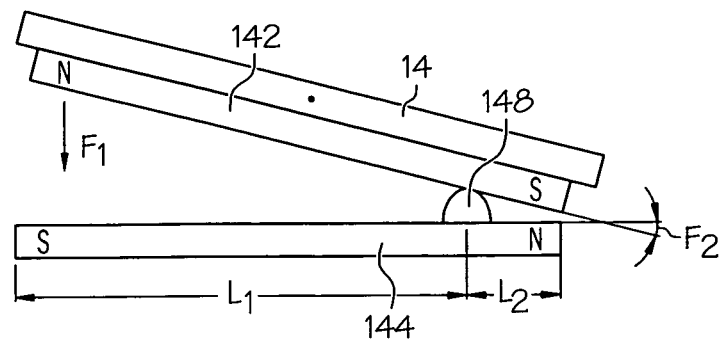
FIG. 21 is a simplified illustration of components of the braking system of FIG. 20.

FIGS. 20-23 schematically represent various other braking system embodiments employing magnetic fields to brake the moveable member 14. FIG. 20 shows moveable member 14 carrying a magnetic component 142. Another magnetic component 144 (e.g., formed of a soft magnetic material) is located within a coil 146 and carried by the frame 12. A current is delivered through the coil 146 (e.g., by controller 28) to perform a braking operation. Referring also to FIG. 21, regardless of whether the moveable member 14 is moving clockwise or counter-clockwise, one end or the other of the magnetic component 142 will be closer to the magnetic component 144. To perform a braking operation, current is delivered through the coil 146 such that the moveable member 14 is pulled toward stop 148. In some embodiments, polarity reversing capability can allow the braking system to be used as a drive mechanism for the moveable member 14 as well.

Referring still to FIG. 21, stop 148 may be located to balance the moment (F times L) created around the stop. Balancing the moments can reduce the load placed on the flexures 16 and 18 during a braking operation. A complimentary stop (not shown) would also be placed at the other end of the structure.

Figure 22:
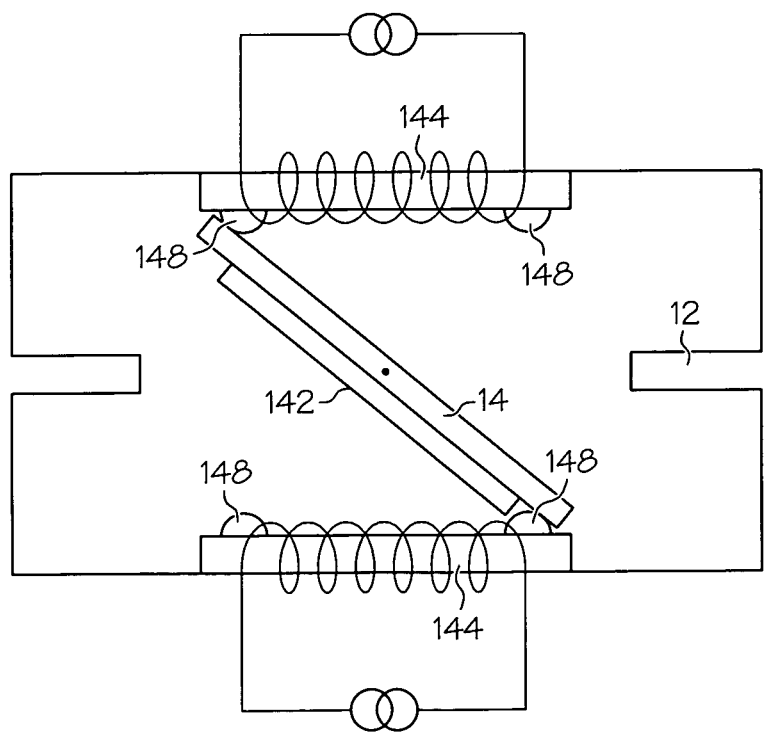
FIG. 22 is a schematic, section view of another embodiment of a braking system for use in braking the moveable member of the MEMS device of FIG. 1.

In another embodiment shown by FIG. 22, magnetic components 144 are located both above and below the moveable member 14 including magnetic component 142. In this embodiment, moveable member 14 contacts stops 148 located at opposite ends of the moveable member during a braking operation, which can reduce the load placed on the flexures 16 and 18.

Figure 23:
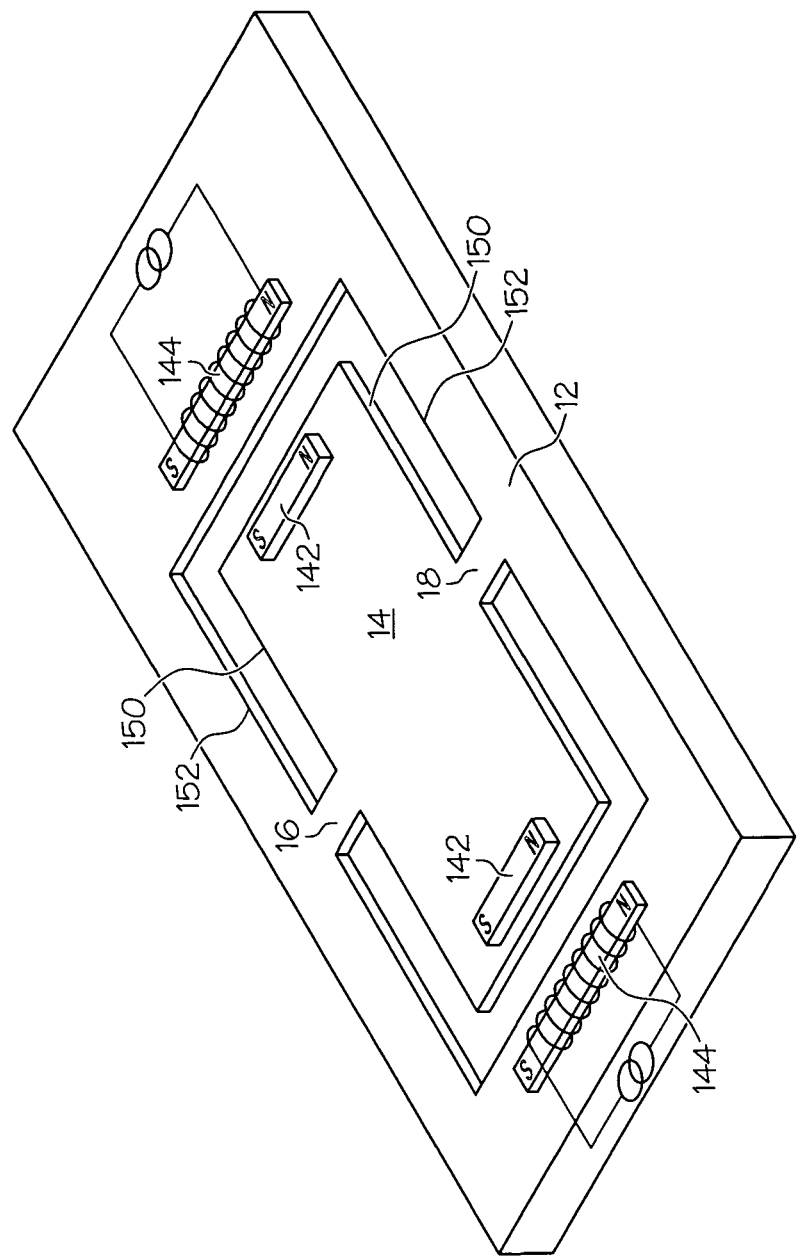
FIG. 23 is a schematic, perspective view of another embodiment of a braking system for use in braking the moveable member of the MEMS device of FIG. 1.

In FIG. 23, a repulsion arrangement is shown where the poles of the magnetic components 142 carried by the moveable member 14 and the poles of the magnetic components 144 mounted to the frame 12 are oriented such that they repulse each other. These repulsive forces drive the moveable member 14 out of the plane and into stops as previously described. As an alternative, the magnetic components 142 and 144 may be oriented 90 degrees from their illustrated positions along edges 150 and 152.

If the magnetic components described above have sufficient magnetic energy, then electro-permanent magnets may be used (e.g., a coil wrapped around a permanent magnet). During operation, current may be delivered through the coil to cancel the magnetic field provided by the permanent magnet and the moveable member 14 may move freely. Interruption of the current (e.g., during non-use) reconstitutes the braking forces.

The magnetic forces and fields required for braking depend on the particulars of the embodiment. For example, the magnetic forces and fields may depend on size and extent of the moveable member 14, acceleration to be resisted, etc.

MEMS device 10 may be formed by any suitable method such as deposition of thin films of material, photolithography and etching. Surface micromachining may be based on conventional integrated circuit (IC) processing steps including material deposition, photolithography, masking, etching, mask stripping and cleaning. A large number of processing steps may be used to form the completed MEMS device 10 based on repeated deposition and patterning of alternating layers of polycrystalline silicon and a sacrificial material (e.g., silicon dioxide or a silicate glass), with the MEMS device being built layer by layer. Suitable processing examples include utilization of SUMMiT™ and SUMMiT V™ technologies available from Sandia National Laboratories, Albuquerque, N. Mex. Various microfabrication techniques are described in Microsystem Design, by Stephen D. Senturia, (Kluwer Academic Publishers, 2001), the content of which is hereby incorporated by reference.

Figure 24:
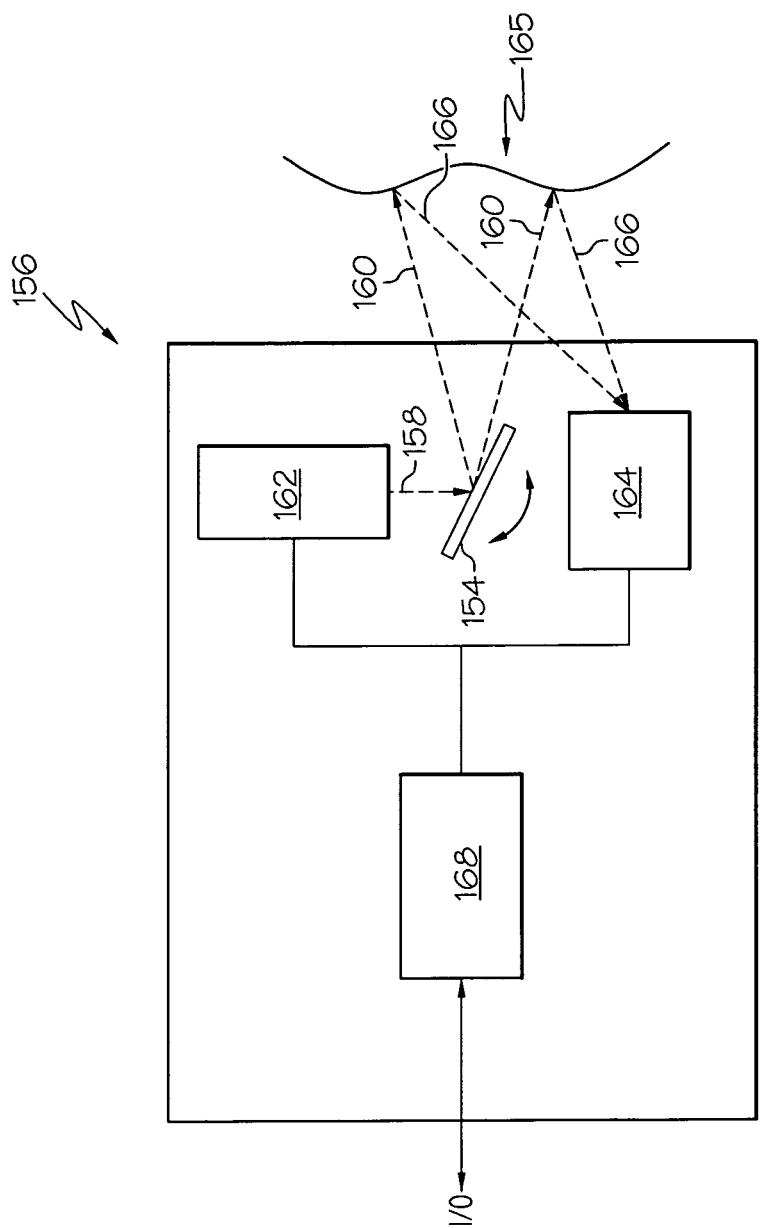
FIG. 24 is a schematic, top view of a scanned beam imager including MEMS scanner.

Referring now to FIG. 24, a MEMS device may be a scanner 154 of a scanned beam imager 156. Scanner 154 includes a moveable component (similar to moveable member 14 described above) that deflects light 158 across a field of view 165 to produce beam of light 160. The light 158 is created by an illuminator 162, which directs the light onto the scanner 154. A detector 164 collects scattered light 166 and produces electrical signals corresponding to the amount of light energy received. Controller 168 builds a digital image and transmits it for further processing.

MEMS scanners are described in, for example, U.S. Pat. No. 6,140,979, entitled SCANNED DISPLAY WITH PINCH, TIMING, AND DISTORTION CORRECTION; U.S. Pat. No. 6,245,590, entitled FREQUENCY TUNABLE RESONANT SCANNER AND METHOD OF MAKING; U.S. Pat. No. 6,285,489, entitled FREQUENCY TUNABLE RESONANT SCANNER WITH AUXILIARY ARMS; U.S. Pat. No. 6,331,909, entitled FREQUENCY TUNABLE RESONANT SCANNER; U.S. Pat. No. 6,362,912, entitled SCANNED IMAGING APPARATUS WITH SWITCHED FEEDS; U.S. Pat. No. 6,384,406, entitled ACTIVE TUNING OF A TORSIONAL RESONANT STRUCTURE; U.S. Pat. No. 6,433,907, entitled SCANNED DISPLAY WITH PLURALITY OF SCANNING ASSEMBLIES; U.S. Pat. No. 6,512,622, entitled ACTIVE TUNING OF A TORSIONAL RESONANT STRUCTURE; U.S. Pat. No. 6,515,278, entitled FREQUENCY TUNABLE RESONANT SCANNER AND METHOD OF MAKING; U.S. Pat. No. 6,515,781, entitled SCANNED IMAGING APPARATUS WITH SWITCHED FEEDS; and U.S. Pat. No. 6,525,310, entitled FREQUENCY TUNABLE RESONANT SCANNER; all of which are hereby incorporated by reference as if fully set forth herein.

Figure 25:
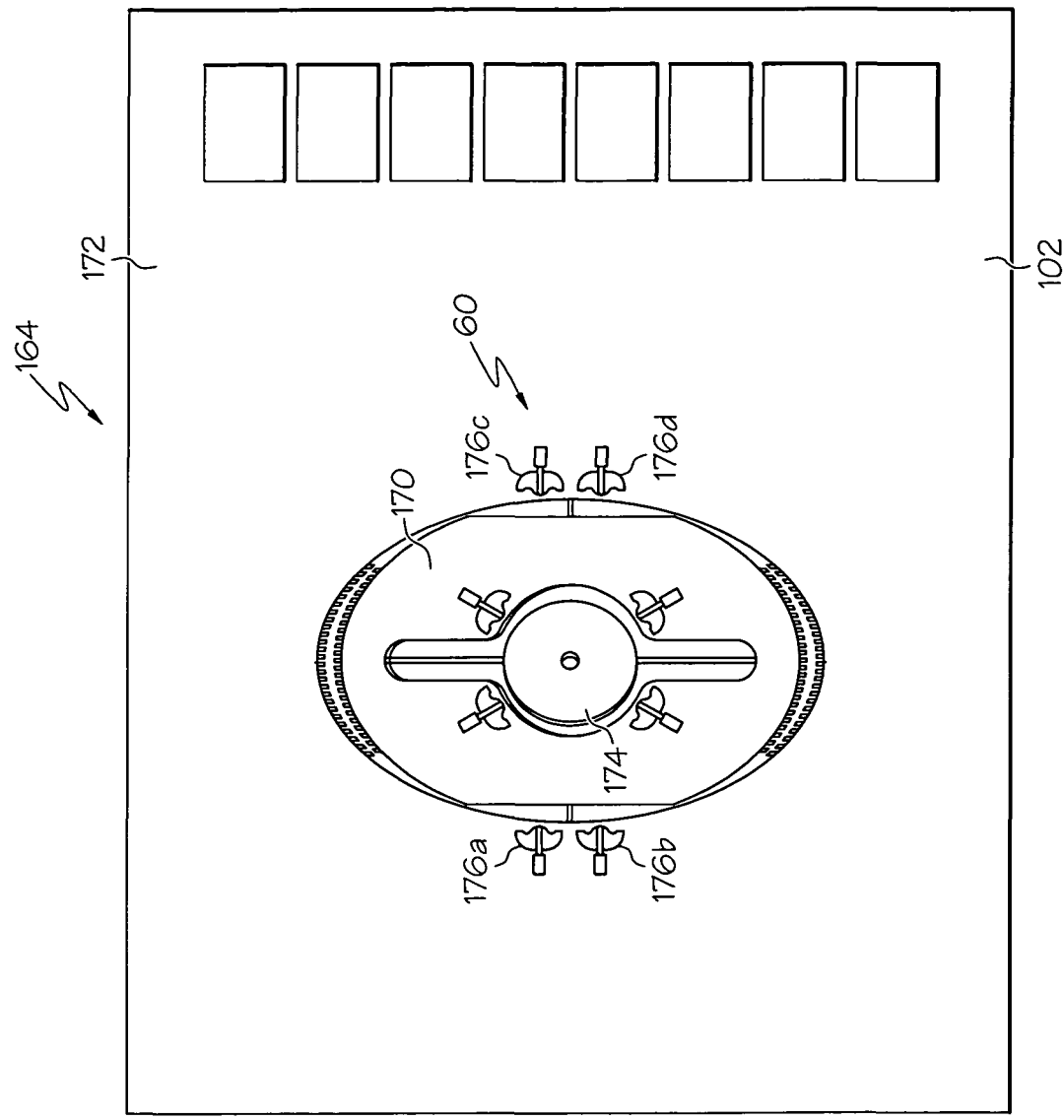
FIG. 25 is an unscaled, schematic perspective view of an embodiment of a MEMS device for optical scanning.
Figure 26:
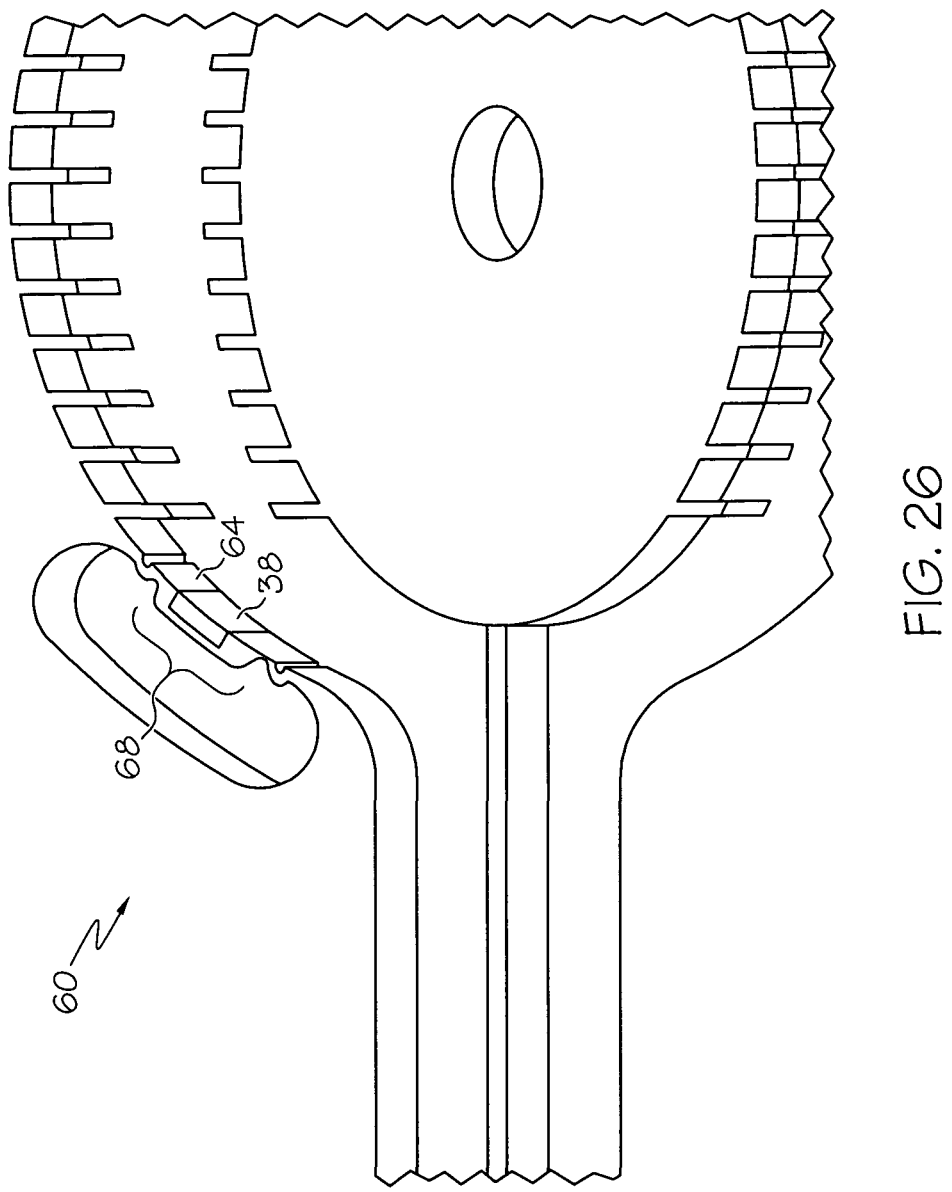
FIG. 26 is a simplified, detail view of a braking component of the MEMS device of FIG. 25.

FIG. 25 schematically illustrates a two-dimensional scanner 164 including braking system 60. A two-dimensional MEMS scanner 164 scans one or more light beams at high speed in a pattern that covers an entire two-dimensional field of view or a selected region of a two-dimensional field of view within a frame period. Scanner 164 includes a first moveable member 170 that rotates or pivots in a first direction relative to frame 172 and a second moveable member 174 that rotates or pivots in a second direction relative to the first moveable member in order to scan the two-dimensional field of view. Braking system 60 includes the braking components 176a-176d located to brake the first moveable member 170 in a fashion similar to that described above with reference to FIGS. 11-13. Referring to FIG. 26, a second braking system 60 including web 64, blocking portion 68 and pad 38 is included to brake the second moveable member 174 (actuator 74 is not shown in FIG. 25). In some embodiments, a combination or another of the above-described braking systems may be used to brake one or both the first and second moveable members 170 and 174.

Figure 27:
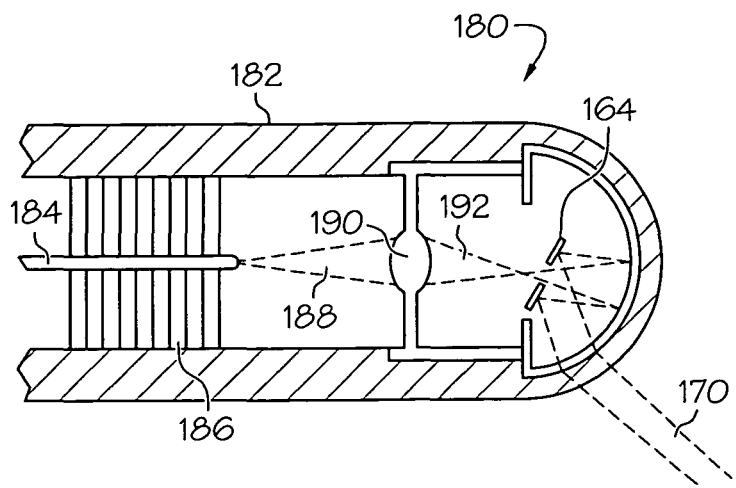
FIG. 27 is a section view of an embodiment of a scanning module for use with a medical device.

Referring to FIG. 27, a scanning module 180 includes a housing 182 that encloses and supports the scanner 164. Optical fiber 184, which may be a single mode fiber, directs light to the scanning module 180 and is affixed to the housing 182 by a ferrule 186. Raw beam 188 is shaped by beam shaping optic 190 to create a beam shape appropriate for transmission through the rest of the system. As shown, all or a portion of beam shaping optic 190 may be moveable or deformable to control beam divergence, waist position, and waist angle. After shaping, shaped beam 192 is fed through an aperture in the center of the MEMS scanner 164, is reflected off a first reflecting surface back onto the front of the scanner, and then out of the scanning module as scanned beam 170.

Scanning module 180 may be used for imaging during a medical procedure. In some implementations, scanning module 180 may be used with a scanning endoscope. Scanning modules and various medical devices such as a scanning endoscope employing a scanned beam imager are disclosed in U.S. patent application Ser. No. 10/873,540, entitled SCANNING ENDOSCOPE, filed Jun. 21, 2004, the contents of which are hereby incorporated by reference as if fully set forth herein.

The above-described braking systems can be used to capture and brace the relatively delicate moveable members during episodes of high acceleration. In some embodiments, the braking system is normally ON, so that unintended movement of the moveable member can be prevented or inhibited even when the MEMS device is not in use.

The controller 28 may determine which of the braking system components to actuate, for example, based on input from the sensors or accelerometers and/or evaluator 41. For example, only certain ones of the actuators may be actuated where a large acceleration is sensed in a particular direction. Alternatively, the controller 28 may actuate all of the actuators where a large acceleration is sensed in a particular direction.

Figure 28:
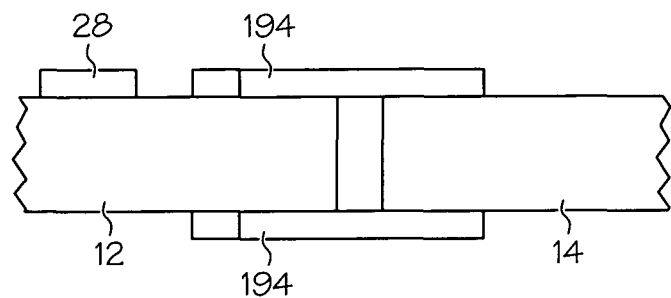
FIG. 28 is a schematic, side view of another embodiment of a braking system in an extended configuration.
Figure 29:
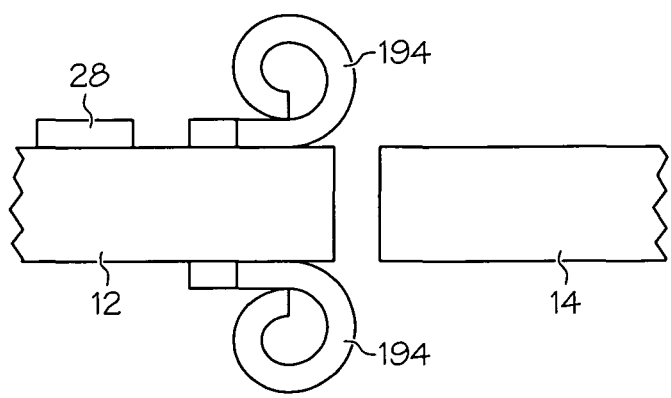
FIG. 29 is a schematic, side view of the braking system of FIG. 27 in a retracted configuration.

A number of detailed embodiments have been described. Nevertheless, it will be understood that various modifications may be made. For example, referring to FIGS. 28 and 29, electroactive polymeric actuators 194 may be used. Such electroactive polymeric actuators 194 may be biased so that they normally block or impede motion of the moveable member (FIG. 28) and when actuated (e.g., a voltage is applied), release or allow movement of the moveable member (FIG. 29). Passive cushions may also be used to inhibit movement of the moveable member. As an alternative to accelerometers 36, anomalous motion of the moveable member itself may be used as an indication of acceleration with respect to the frame 12. For example, in embodiments where moveable member is a mirror, measurement of a deflected beam of light might serve as an indication of acceleration. Accordingly, other embodiments are within the scope of the following claims.

What is claimed is:

1. A micro-electromechanical device, comprising:
a frame;
a moveable member movably connected to the frame such that the moveable member is capable of movement relative to the frame;
a drive system for use in moving the moveable member relative to the frame;
a braking system that inhibits movement of the moveable member relative to the frame;
a controller that controls movement of the moveable member; and
a sensor that provides a signal indicative of acceleration of the micro-electromechanical device to the controller;
wherein the controller controls the braking system based on the signal provided by the sensor.

2. The micro-electromechanical device of claim 1, wherein the braking system has a first configuration that inhibits movement of the moveable member relative to the frame and a second configuration that allows for movement of the moveable member relative to the frame.

3. The micro-electromechanical device of claim 2, wherein the braking system comprises an actuator.

4. The micro-electromechanical device of claim 3, wherein the actuator comprises a cylinder and a piston located partially in the cylinder, the piston being moveable linearly relative to the cylinder from a retracted position that is removed from the moveable member and an extended position in contact with the moveable member for a braking operation.

5. The micro-electromechanical device of claim 4, wherein the piston is actuated by heating and expanding a material located in the cylinder using an electric current.

6. The micro-electromechanical device of claim 5, wherein capillary forces retract the piston into the cylinder once the electric current is removed and the material cools.

7. The micro-electromechanical device of claim 6, wherein the material undergoes a phase change due to application of the current.

8. The micro-electromechanical device of claim 7, wherein the material is water, and the current heats and vaporizes the water to extend the piston.

9. The micro-electromechanical device of claim 7, wherein the material is wax, and the current heats and melts the wax to extend the piston.

10. A micro-electromechanical device comprising:
a frame;
a moveable member movably connected to the frame such that the moveable member is capable of movement relative to the frame;
a drive system for use in moving the moveable member relative to the frame;
a braking system that inhibits movement of the moveable member relative to the frame;
a controller that controls movement of the moveable member; and
a sensor that provides a signal indicative of acceleration of the micro-electromechanical device to the controller, wherein the controller controls the braking system based on the signal provided by the sensor;
wherein the braking system has a first configuration that inhibits movement of the moveable member relative to the frame and a second configuration that allows for movement of the moveable member relative to the frame, and the braking system comprises:
an actuator; and
a flexible web having a blocking portion disposed between the actuator and the moveable member, the flexible web configured to be moved by the actuator into and out of contact with the moveable member.

11. The micro-electromechanical device of claim 10, wherein the flexible web is located adjacent an etched opening that extends through the frame.

12. The micro-electromechanical device of claim 10 further comprising a pad carried by the flexible web and located to contact the moveable member for a braking operation, the pad having a hardness that is less than that of the flexible web.

13. The micro-electromechanical device of claim 10 further comprising a pad carried by the flexible web and located to contact the moveable member for a braking operation, the pad having a hardness that is greater than that of the flexible web.

14. The micro-electromechanical device of claim 10 further comprising a pad carried by the flexible web and located to contact the moveable member for a braking operation, the pad comprising an elastomer, a plastic, a metal, an amorphous diamond, or a composite of one or more of these.

15. The micro-electromechanical device of claim 3, wherein the actuator comprises an electroactive polymeric material.

16. The micro-electromechanical device of claim 1, wherein the moveable member comprises a scanner including a mirror.

17. The micro-electromechanical device of claim 16, wherein the scanner is configured to scan a beam of light across two dimensions over a field of view using the mirror.

18. The micro-electromechanical device of claim 17, wherein the scanner comprises a first scanning member that is moveable relative to the frame and a second scanning member that is moveable relative to the first scanning member and the frame.

19. The micro-electromechanical device of claim 1, wherein the braking system uses a magnetic field to inhibit movement of the moveable scanner relative to the frame.

20. The micro-electromechanical device of claim 1, wherein the sensor comprises an accelerometer.

21. The micro-electromechanical device of claim 20 comprising multiple accelerometers, arranged to sense both angular and linear accelerations, that provide signals indicative of acceleration to the controller.

22. The micro-electromechanical device of claim 1, wherein the drive system comprises an electrostatic comb drive.

23. A medical device configured to be inserted into a patient's body, the medical device comprising:
a micro-electromechanical scanning device for optical scanning of a field of view within the patient's body, the micro-electromechanical scanning device comprising a frame, a scanning member movably connected to the frame such that the scanning member is capable of movement relative to the frame, with the scanning member being configured to direct light across a field-of-view, a drive system for use in moving the scanning member relative to the frame, and a braking system that inhibits movement of the scanning member relative to the frame;
a controller that controls movement of the scanning member; and a sensor that provides a signal indicative of acceleration of the micro-electromechanical scanning device to the controller;

wherein the controller controls the braking system based on the signal provided by the sensor.

24. The medical device of claim 23 further comprising an optical fiber for directing light to the micro-electromechanical scanning device.

25. The medical device of claim 23, wherein the braking system has a first configuration that inhibits movement of the scanning member relative to the frame and a second configuration that allows for movement of the scanning member relative to the frame.

26. The medical device of claim 25, wherein the braking system comprises an actuator.

27. The medical device of claim 26, wherein the actuator comprises an electroactive polymeric material.

28. The medical device of claim 23 wherein the scanning member includes a mirror.

29. The medical device of claim 28, wherein the scanning member is configured to scan a beam of light across two dimensions over a field of view using the mirror.

30. The medical device of claim 23, wherein the braking system uses a magnetic field to inhibit movement of the scanning member relative to the frame.

31. The medical device of claim 23, wherein the sensor comprises an accelerometer.

32. The micro-electromechanical device of claim 1, wherein the sensor provides a signal indicative of acceleration of the frame, and the controller activates the braking system if the acceleration is above a predetermined threshold.

33. The medical device of claim 26, wherein the actuator comprises a cylinder and a piston located partially in the cylinder, the piston being moveable linearly relative to the cylinder from a retracted position that is removed from the moveable member and an extended position in contact with the moveable member for a braking operation.

34. The medical device of claim 33, wherein the piston is actuated by heating and expanding a material located in the cylinder using an electric current.

35. The medical device of claim 26 further comprising a flexible web having a blocking portion disposed between the actuator and the moveable member, the flexible web configured to be moved by the actuator into and out of contact with the moveable member.

36. The medical device of claim 35, wherein the flexible web is located adjacent an etched opening that extends through the frame.

37. The medical device of claim 31 comprising multiple accelerometers, arranged to sense both angular and linear accelerations, that provide signals indicative of acceleration to the controller.

* * * * *